(12) United States Patent
Ellinger et al.

(10) Patent No.: US 9,634,145 B2
(45) Date of Patent: Apr. 25, 2017

(54) TFT SUBSTRATE WITH VARIABLE DIELECTRIC THICKNESS

(71) Applicants: Carolyn Rae Ellinger, Rochester, NY (US); Shelby Forrester Nelson, Pittsford, NY (US)

(72) Inventors: Carolyn Rae Ellinger, Rochester, NY (US); Shelby Forrester Nelson, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/526,622

(22) Filed: Oct. 29, 2014

(65) Prior Publication Data

US 2016/0126344 A1 May 5, 2016

(51) Int. Cl.
*H01L 29/786* (2006.01)
*H01L 29/423* (2006.01)
*H01L 29/66* (2006.01)

(52) U.S. Cl.
CPC ...... *H01L 29/786* (2013.01); *H01L 29/42384* (2013.01); *H01L 29/66969* (2013.01); *H01L 2029/42388* (2013.01)

(58) Field of Classification Search
CPC ............. H01L 29/786; H01L 29/42384; H01L 29/66969
See application file for complete search history.

(56) References Cited

U.S. PATENT DOCUMENTS

| | | |
|---|---|---|
| 5,828,082 A | 10/1998 | Wu |
| 6,921,951 B2 | 7/2005 | Lai |
| 7,413,982 B2 | 8/2008 | Levy |
| 7,456,429 B2 | 11/2008 | Levy |
| 7,789,961 B2 | 9/2010 | Nelson et al. |
| 7,998,878 B2 | 8/2011 | Levy et al. |
| 8,017,183 B2 | 9/2011 | Yang et al. |
| 8,031,160 B2 | 10/2011 | Chen et al. |
| 8,536,579 B2 | 9/2013 | Sele et al. |
| 8,653,516 B1 | 2/2014 | Nelson et al. |

(Continued)

OTHER PUBLICATIONS

Dodabalapur et al., "Organic Transistors Two Dimensional Transport and Improved Electrical Characteristics", *Science*, Apr. 1995, pp. 270-271.

(Continued)

*Primary Examiner* — Charles Garber
*Assistant Examiner* — Brigitte Paterson
(74) *Attorney, Agent, or Firm* — William R. Zimmerli; Kevin E. Spaulding

(57) ABSTRACT

A transistor includes a substrate and an electrically conductive gate over the substrate. The gate has a gate length. A source electrode and a drain electrode are over the substrate, and are separated by a gap defining a channel region. The channel region has a channel length that is less than the gate length. A semiconductor layer is in contact with the source electrode and drain electrode. A dielectric stack is in contact with the gate, and has first, second, and third regions. The first region is in contact with the semiconductor layer in the channel region, and has a first thickness. The second region is adjacent to the first region that has the first thickness. The third region is adjacent to the second region, and has a thickness that is greater than the first thickness.

9 Claims, 23 Drawing Sheets

(56) References Cited

U.S. PATENT DOCUMENTS

| | | |
|---|---|---|
| 8,791,023 B2 | 7/2014 | Ellinger et al. |
| 8,846,545 B2 | 9/2014 | Ellinger et al. |
| 2005/0084610 A1 | 4/2005 | Selitser |
| 2009/0081827 A1 | 3/2009 | Yang et al. |
| 2009/0130608 A1 | 5/2009 | Irving et al. |
| 2009/0130858 A1 | 5/2009 | Levy |
| 2009/0212376 A1 | 8/2009 | Adkisson et al. |
| 2009/0278120 A1* | 11/2009 | Lee et al. .................. 257/43 |
| 2010/0032662 A1 | 2/2010 | Whiting et al. |
| 2010/0224871 A1* | 9/2010 | Yamaguchi ......... H01L 29/7869 257/43 |
| 2010/0252826 A1 | 10/2010 | Yamazaki et al. |
| 2011/0062432 A1* | 3/2011 | Yamazaki et al. .............. 257/43 |
| 2011/0248270 A1* | 10/2011 | Fukumoto ............. H01L 29/517 257/59 |
| 2014/0061648 A1 | 3/2014 | Levy et al. |
| 2014/0061795 A1 | 3/2014 | Levy et al. |
| 2014/0061869 A1 | 3/2014 | Nelson et al. |
| 2014/0065830 A1 | 3/2014 | Ellinger et al. |
| 2014/0065838 A1 | 3/2014 | Ellinger et al. |
| 2014/0183524 A1 | 7/2014 | Jeoung |

OTHER PUBLICATIONS

Sze, "Physics of Semiconductor Devices", *Semiconductor Devices-Physics and Technology*, John Wiley & Sons, 1981, pp. 438-443.

Sinha, A. et al., *Journal of Science and Technology B*, vol. 24, No. 6, Nov./Dec. 2006, pp. 2523-2532.

Suntola, T., *Handbook of Thin Film Process Technology*, vol. 1, edited by Glocker et al., Institute of Physics (IOP) Publishing, Philadelphia 1995, pp. B1.5:1 to B1.5:16.

Ritala, M. et al., *Handbook of Thin Film Materials*, vol. 1, edited by Nalwa, pp. 103-159.

* cited by examiner

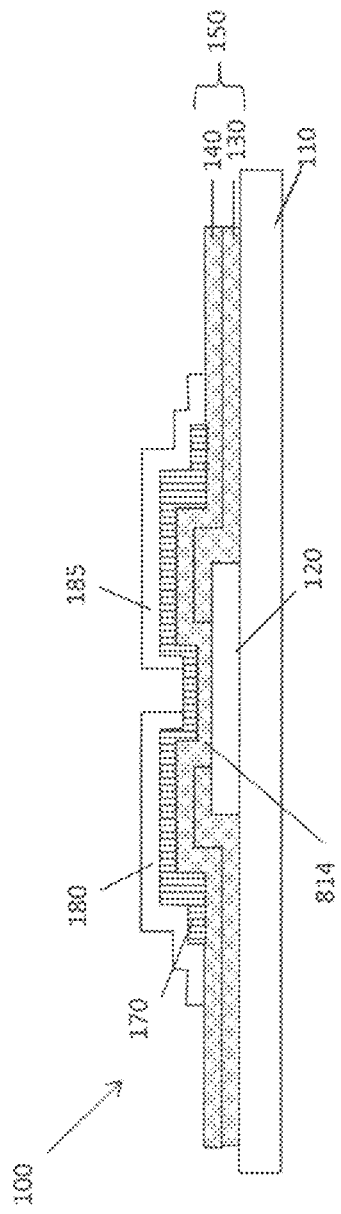
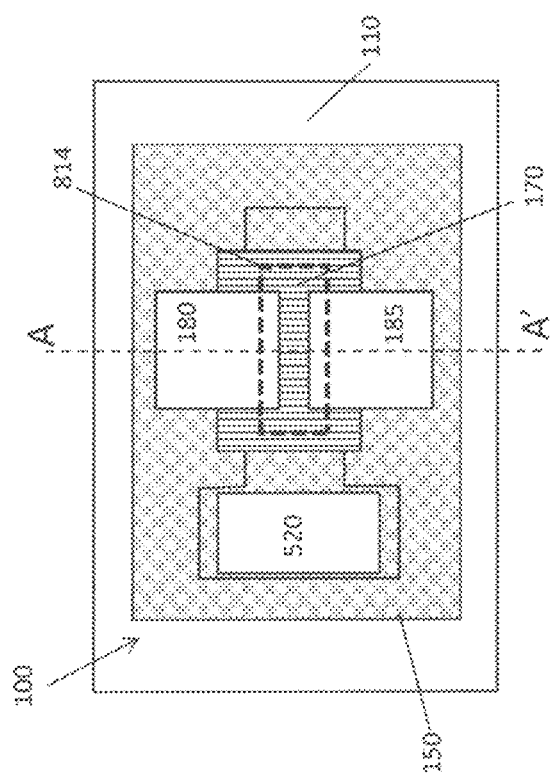
Figure 1a
Figure 1b

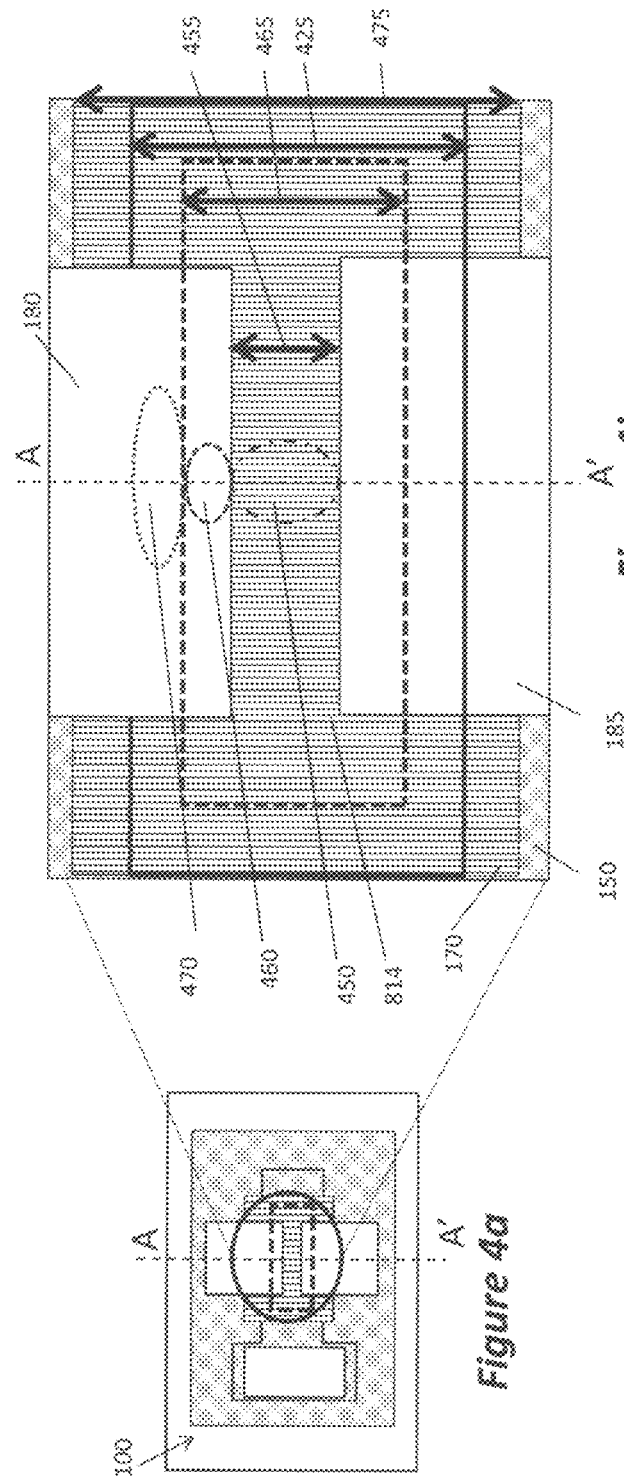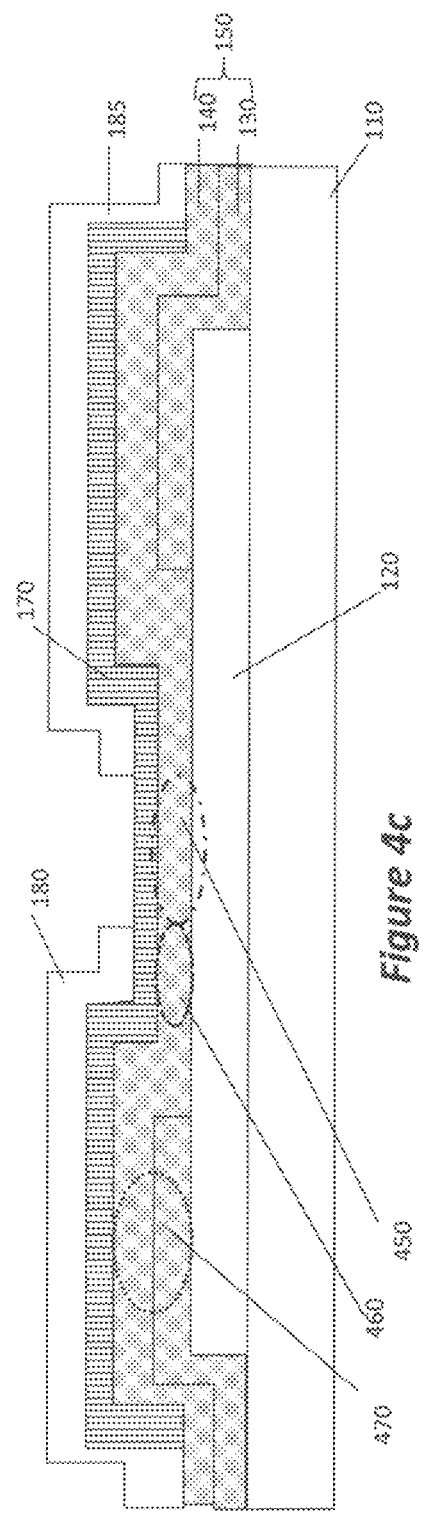
Figure 4a
Figure 4b
Figure 4c

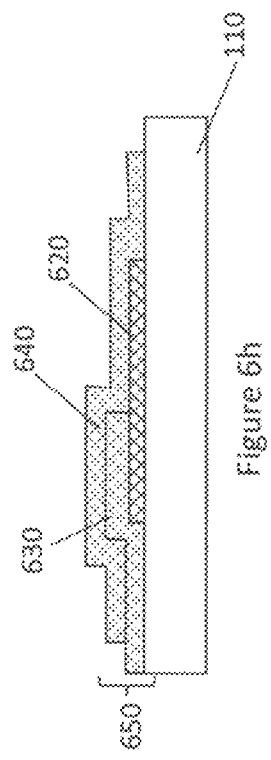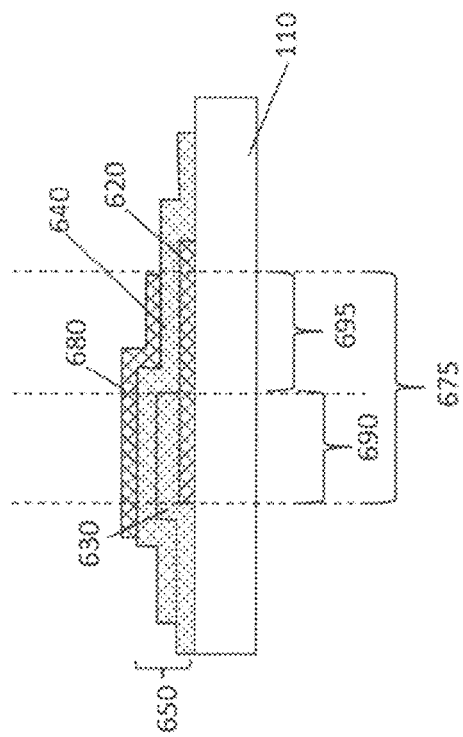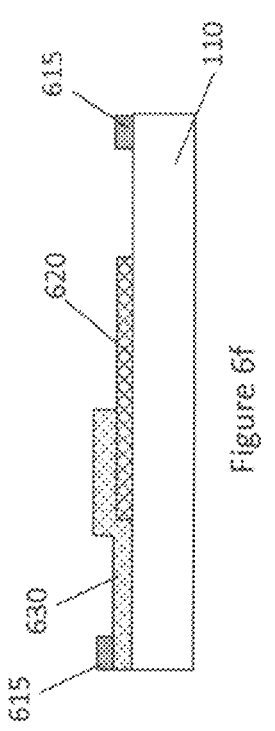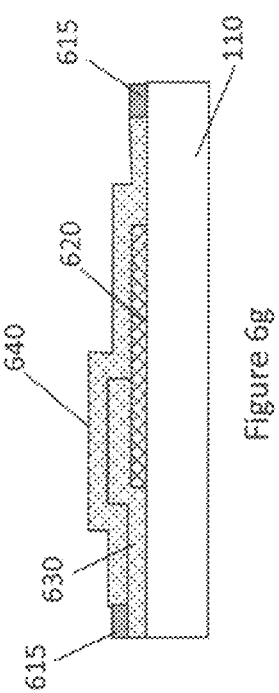

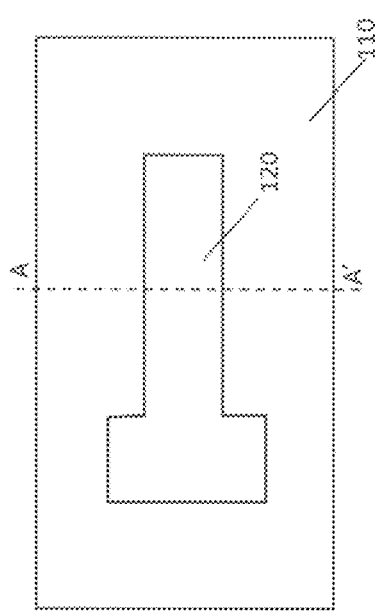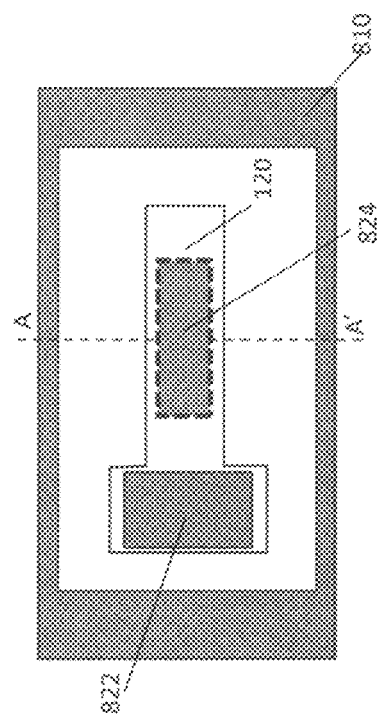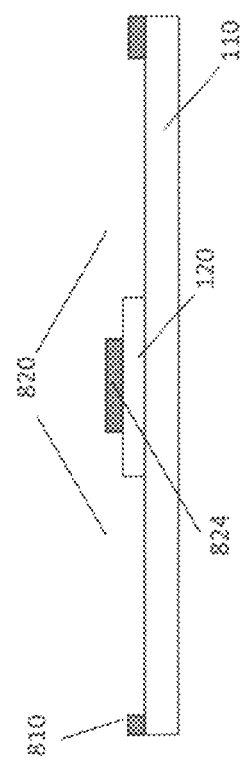
Figure 8b
Figure 9b
Figure 8a
Figure 9a

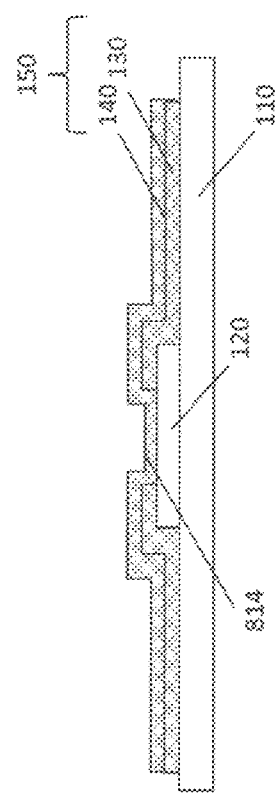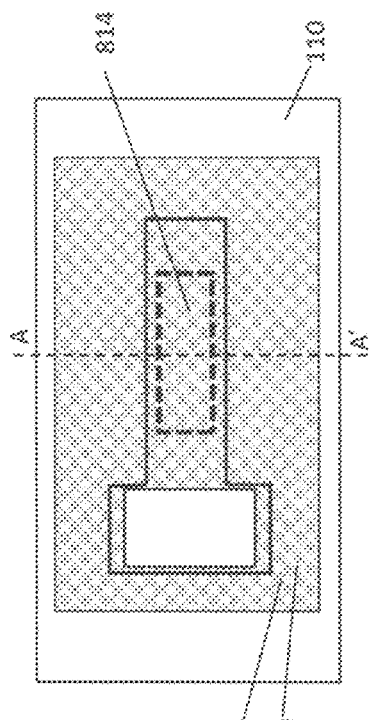
*Figure 14a*
*Figure 14b*
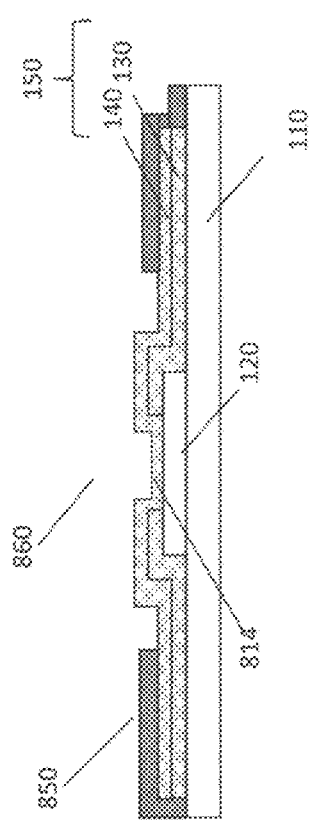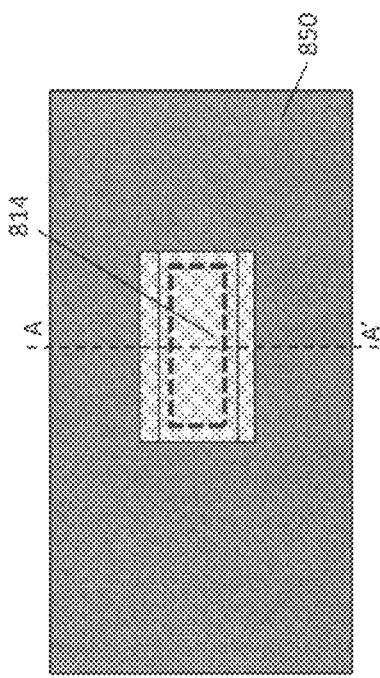
*Figure 15a*
*Figure 15b*

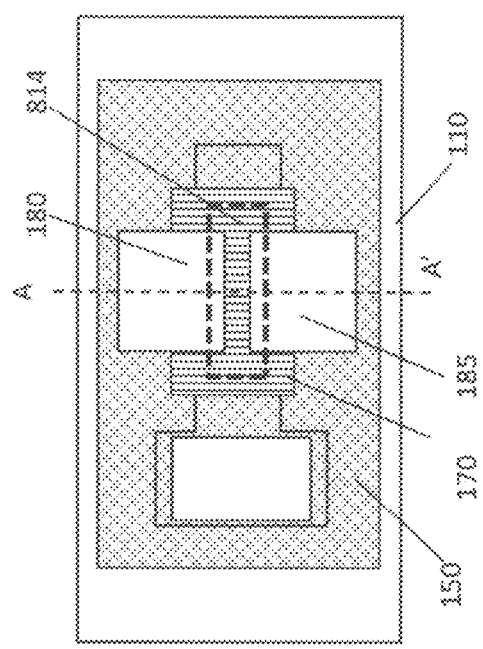
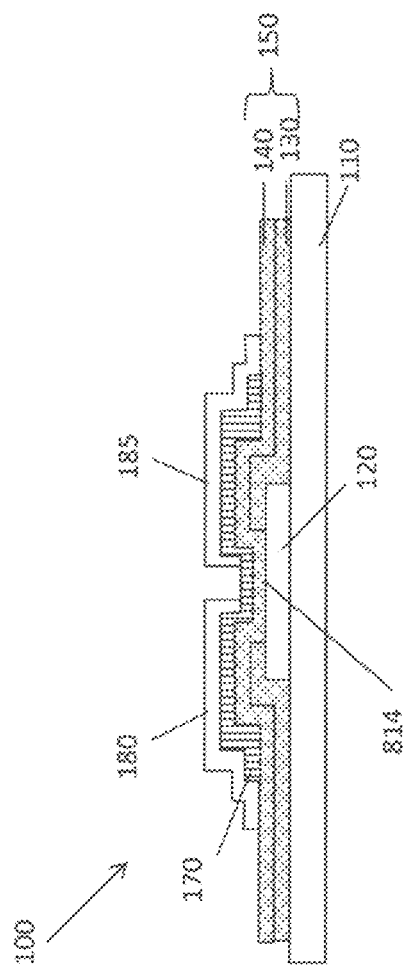
Figure 20b
Figure 20a

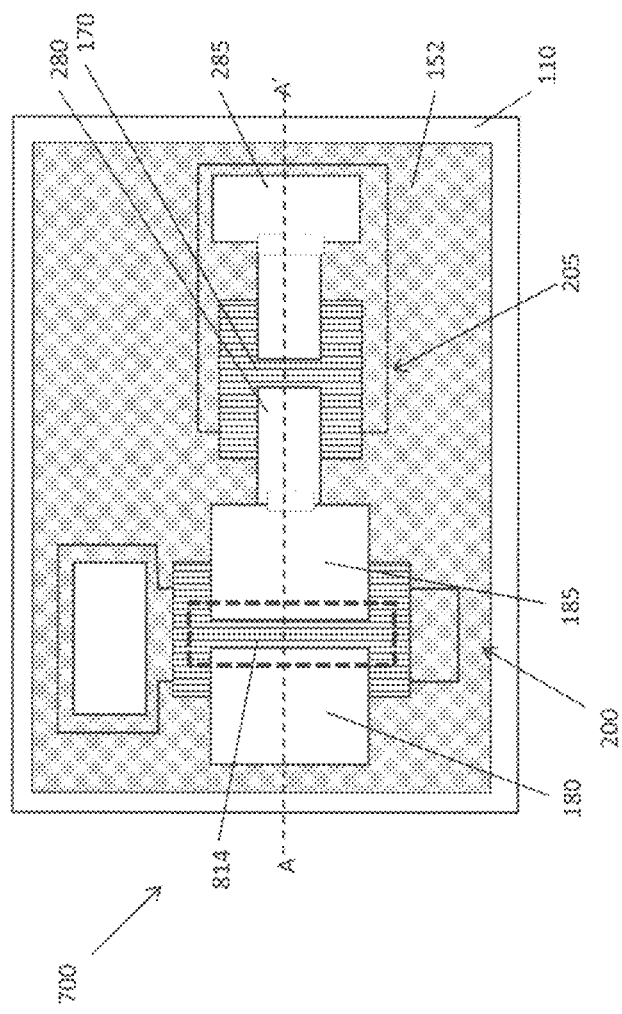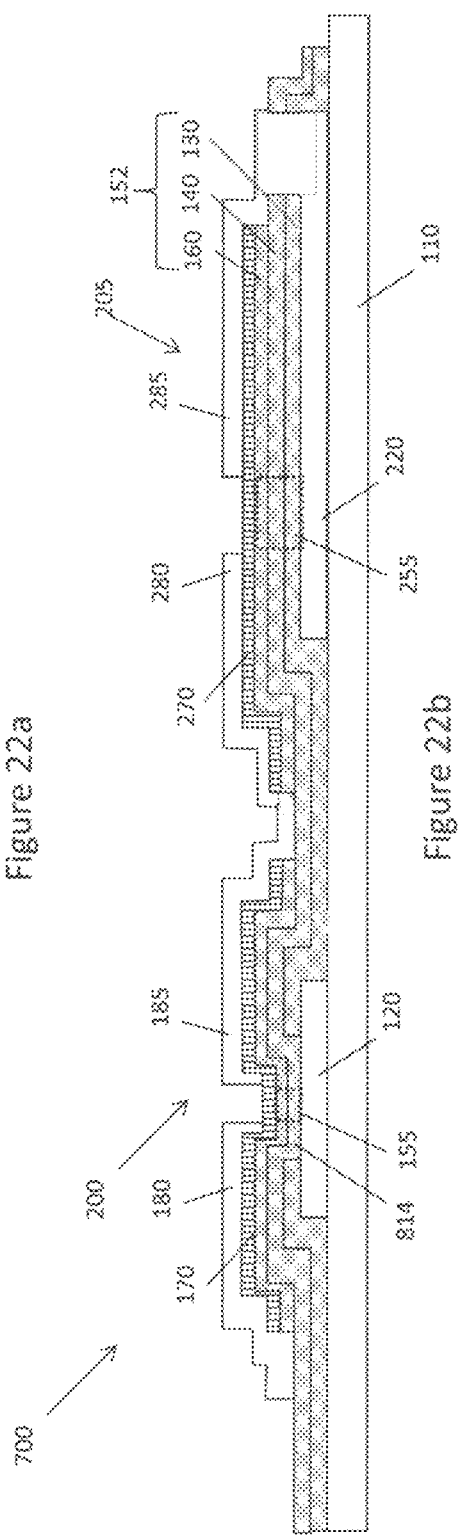
Figure 22a
Figure 22b

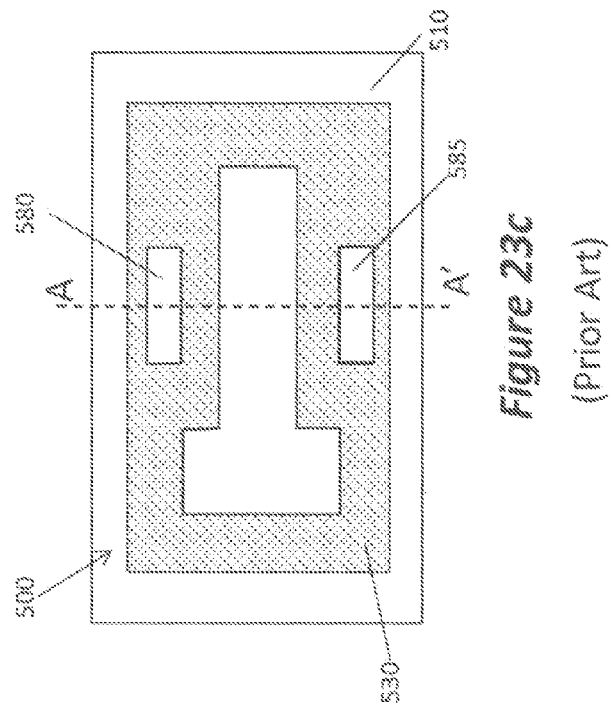
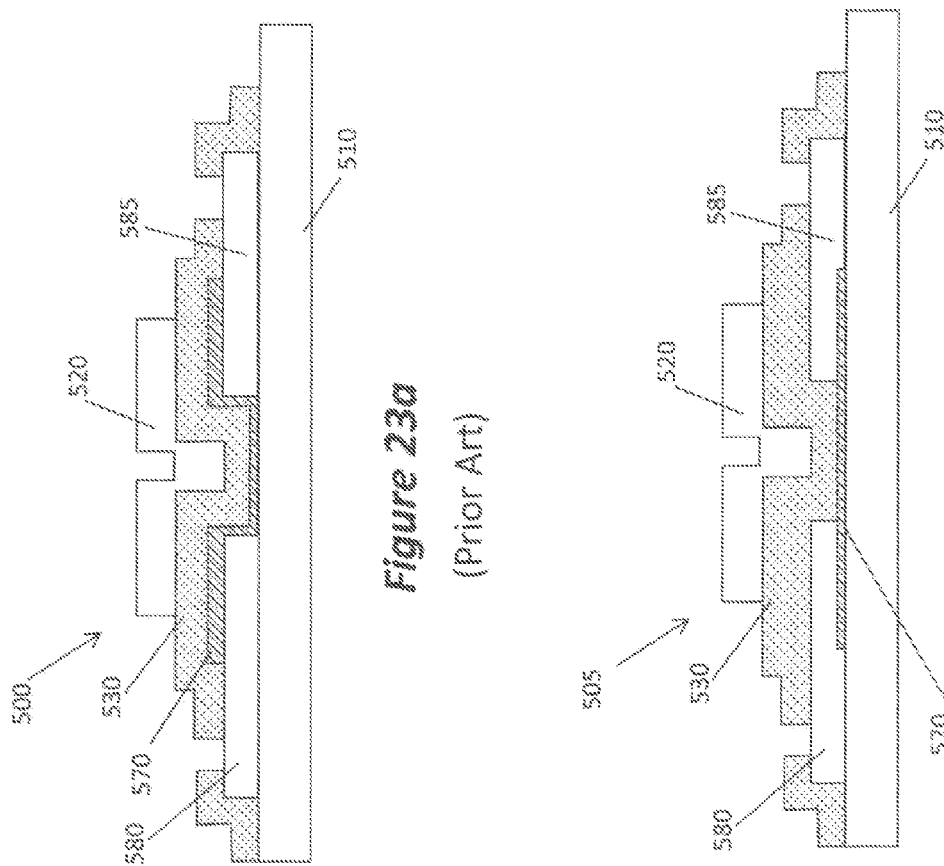
Figure 23a (Prior Art)
Figure 23b (Prior Art)
Figure 23c (Prior Art)

TFT SUBSTRATE WITH VARIABLE DIELECTRIC THICKNESS

CROSS REFERENCE TO RELATED APPLICATIONS

Reference is made to commonly-assigned, U.S. patent application Ser. No. 14/526,634, entitled "ENHANCEMENT-DEPLETION MODE INVERTER WITH TWO TRANSISTOR ARCHITECTURES", Serial No. 14/526.652, entitled "METHOD FOR FORMING A VARIABLE THICKNESS DIELECTRIC STACK", Ser. No. 14/526,675, entitled "ENHANCEMENT MODE INVERTER WITH VARIABLE THICKNESS DIELECTRIC STACK", all filed concurrently herewith.

FIELD OF THE INVENTION

This invention relates generally to patterned thin film fabrication and electronic and optoelectronic devices including patterned thin films. In particular, this invention relates to selective area deposition of materials including, for example, metal-oxides and devices including, for example, thin film transistors, inverters and circuits produced using, for example, this fabrication technique.

BACKGROUND OF THE INVENTION

Modern-day electronics require multiple patterned layers of electrically or optically active materials, sometimes over a relatively large substrate. Electronics such as radio frequency identification (RFID) tags, photovoltaics, optical and chemical sensors all require some level of patterning in their electronic circuitry. Flat panel displays, such as liquid crystal displays or electroluminescent displays (for example, OLED), rely upon accurately patterned sequential layers to form thin film components of the backplane. These components include capacitors, transistors, and power buses. The industry is continually looking for new methods of materials deposition and layer patterning for both performance gains and cost reductions. Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof.

There is a growing interest in depositing thin film semiconductors on plastic or flexible substrates, particularly because these supports are more mechanically robust, lighter weight, and allow more economical manufacturing, for example, by allowing roll-to-roll processing. Plastics, however, typically limit device processing to below 200° C. There are other many issues associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have additional advantages for certain applications. Additionally, metal oxide dielectrics such as alumina ($Al_2O_3$) and $TiO_2$ are useful in practical electronics applications as well as optical applications such as interference filters. Dielectric materials that are easily processable and patternable are also important to the success of low cost and flexible electronic devices. In addition, metal oxide materials can serve as barrier or encapsulation elements in various electronic devices. These materials also require patterning so that a connection can be made to the encapsulated devices.

Atomic layer deposition (ALD) can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. A number of device structures can be made with the functional layers described above.

There is growing interest in combining ALD with a technology known as selective area deposition (SAD). As the name implies, selective area deposition involves treating portion(s) of a substrate such that a material is deposited only in those areas that are desired, or selected. The majority of SAD work to date has focused on the problem of patterning a single material during deposition. There persists a problem of combining multiple SAD steps to form working devices, Processes for building complete devices need to be able to control the properties the critical interfaces, particularly in field effect devices like TFTs.

The majority of electronic devices require a high quality dielectric layer. Although there are many approaches to forming a high quality dielectric layer, they typically fall into one of two categories: a single thick layer of a single material or multiple layers of differing material types. In the case of devices which use a single layer dielectric, large thicknesses are required for defect mitigation to ensure high device yield. This required layer thickness typically requires long processing times and limits the functionality of field effect devices. Devices formed with a multilayer stack of materials use thin layers of materials deposited using the same equipment requiring complex equipment design and multiple precursors. Accordingly, there still remains a need for a high quality dielectric that can be formed from a single material for ease of processing and single precursors, and that doesn't require a thick layer for performance and device yield. Additionally, a method is needed to simply pattern this layer for easy device integration.

A particularly useful electronic device in building functional circuitry is an inverter, which functions to invert the polarity of an input signal. In CMOS circuitry, inverters are typically easy to design but disadvantageously expensive to produce and utilize complicated production processes. It is possible to build all NMOS or PMOS inverters, however particularly for enhancement-depletion mode circuits there are challenges to independently controlling the behavior of each transistor in the inverter circuit. Typically, the depletion mode transistor will have a thicker semiconductor layer than the enhancement mode transistor, increasing process complexity and increasing cost. Other alternatives include using dual gate architectures or multilayer semiconductor stacks, which have similar issues of process complexity and cost. As the industry endeavors to build circuitry using printing methods, individual transistor size has a direct impact on the overall circuit footprint on something like a label, as the individual component transistors are sized using their channel dimensions. There remains a need to build high quality inverters using simple processes, by employing novel architectures to control transistor, and therefore, circuit performance.

SUMMARY OF THE INVENTION

According to an aspect of the invention, a transistor includes a substrate and an electrically conductive gate over the substrate. The gate has a gate length. A source electrode and a drain electrode are over the substrate, and are separated by a gap defining a channel region. The channel region has a channel length that is less than the gate length. A semiconductor layer is in contact with the source electrode and drain electrode. A dielectric stack is in contact with the gate, and has first, second, and third regions. The first region is in contact with the semiconductor layer in the channel region, and has a first thickness. The second region is adjacent to the first region that has the first thickness. The third region is adjacent to the second region, and has a thickness that is greater than the first thickness.

BRIEF DESCRIPTION OF THE DRAWINGS

In the detailed description of the example embodiments of the invention presented below, reference is made to the accompanying drawings, in which:

FIGS. 1a and 1b are a cross-sectional view and a plan view, respectively, of an example embodiment of a bottom gate TFT including an example embodiment of a variable thickness dielectric stack of the present invention;

FIG. 4a is a plan view of an example embodiment of a bottom gate TFT including an example embodiment of a variable thickness dielectric stack of the present invention;

FIGS. 4b and 4c are expanded plan view and cross sectional view of the region near the channel region shown in FIG. 4a;

FIGS. 6a through 6i are cross-sectional side views of an example embodiment of the process, described in FIG. 5, of forming the patterned variable thickness dielectric;

FIGS. 8a and 8b through 20a and 20b are cross-sectional side views and plan views, respectively, of an example embodiment of the process, described in FIG. 7, of forming a bottom gate TFT with a patterned variable thickness dielectric;

FIGS. 22a and 22b are a plan view and a cross-sectional view, respectively, of an example embodiment of an inverter using a drive TFT having the variable thickness dielectric stack of the present invention;

FIGS. 23a and 23b are cross-sectional views of a top-gate TFT;

FIG. 23c is a plan view of the top-gate TFTs shown in FIGS. 23a and 23b;

DETAILED DESCRIPTION OF THE INVENTION

Figure 2:
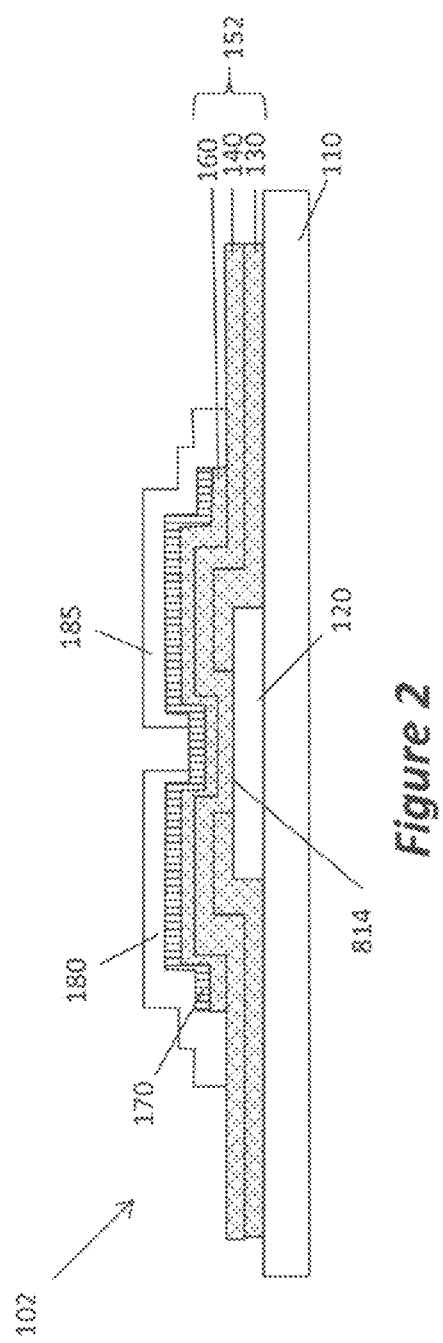
FIG. 2 is a cross-sectional view of an embodiment of a bottom gate TFT having a buffer layer and the variable thickness dielectric stack of the present invention.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on", "over", "top", "bottom", "left", "right" are used with reference to the orientation of the Figure(s) being described. Because components of embodiments of the present invention can be positioned in a number of different orientations, the directional terminology is used for purposes of illustration only and is in no way limiting.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the figures provided are not drawn to scale but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

The present invention is useful for making transistors with variable dielectric layer thickness. The ability to spatially control the dielectric layer thickness provides a means for adding extra protection against shorting, reduced capacitance, and the use of dielectric layer thickness to size the various TFTs in a circuit, in addition to the commonly used channel dimensions, width (W) and length (L). There are two types of TFTs useful in circuit design—enhancement-mode and depletion-mode devices. An enhancement-mode transistor is a transistor in which there is negligible off-current flow relative to on-current flow between a source and a drain at zero gate voltage. In other words, the transistor device is normally off. In contrast, a depletion-mode transistor is normally on meaning that more than substantially negligible current flows between a source and a drain at zero gate voltage.

When the TFT operates in an enhancement-mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, *Science* 1995, 268, 270, hereby incorporated by reference. In the absence of a gate field the channel ideally has few charge carriers; as a result there is ideally no source-drain conduction when the device is in off mode.

The off-current in an enhancement-mode device is defined as the current flowing between the source electrode and the drain electrode when charge has not been intentionally injected into the channel by the application of a gate voltage. This occurs for a gate-source voltage more negative, assuming an re-channel device, than a certain voltage known as the threshold voltage. See Sze in *Semiconductor Devices—Physics and Technology*, John Wiley & Sons (1981), pages 438-443, hereby incorporated by reference. The on-current is defined as the current flowing between the source electrode and the drain electrode when charge carriers have been accumulated intentionally in the channel by application of an appropriate voltage to the gate electrode and the channel is conducting. For an n-channel accumulation-mode TFT, this occurs at a gate-source voltage more positive than the threshold voltage. It is desirable for this threshold voltage to be slightly positive, for enhancement mode n-channel operation. Switching between on and off states is accomplished by the application and removal of an electric field from the gate electrode across the gate dielectric to the semiconductor-dielectric interface, effectively charging a capacitor.

Attractive enhancement mode TFT device characteristics include a large ratio of the on-current to the off-current, and a steep sub-threshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L}\mu C_{ox}(V_g - V_{th})^2$$

where $I_d$ is the saturation source-drain current, $C_{ox}$ is the geometric gate capacitance associated with the insulating layer, W and L are physical device dimensions, $\mu$ is the carrier mobility in the zinc-oxide-based semiconductor, $V_g$ is the applied gate voltage, and $V_{th}$ is the threshold voltage. Ideally, the TFT allows passage of current only when a gate voltage of appropriate polarity is applied. However, with zero gate voltage, the off current between source and drain depends on the intrinsic conductivity a of the zinc-oxide-based semiconductor as well as the state of the semiconductor back channel.

The TFT structures described herein include an inorganic semiconductor channel, preferably a metal-oxide-based semiconductor, with conducting electrodes, commonly referred to as a source and a drain, for injecting a current into the semiconductor and a capacitively coupled gate for controlling and/or modulating the source-drain current. Preferred metal oxide based semiconductors include ZnO based semiconductors. Examples of ZnO based semiconductors are ZnO, InZnO, InO, and InGaZnO and doped ZnO.

The production of inorganic thin film transistors and electronic devices from semiconductor, dielectric, conductive materials can be accomplished by conventional techniques known to the skilled artisan. The exact process sequence is determined by the structure of the desired transistor. Thus, in the production of a field effect transistor in a so-called inverted structure, a gate electrode can be first deposited on a substrate, for example a vacuum- or solution-deposited metal or organic conductor, or an ALD-deposited conductor. The gate electrode is insulated with a dielectric and the source and drain electrodes and a layer of the inorganic semiconductor material are applied on top. The structure of such a transistor, and hence the sequence of its production, are varied in the customary manner known to a person skilled in the art. Alternatively, a gate electrode is deposited first, followed by a gate dielectric, the semiconductor is applied, and finally the contacts for the source electrode and drain electrode are deposited on the semiconductor layer. In an alternative third structure, often called a top-gate structure, the source and drain electrodes are deposited first, then the semiconductor is deposited, and finally the dielectric and gate electrode are deposited on top. In yet another embodiment, the semiconductor is deposited first, prior to depositing the source and drain electrodes. In most embodiments, a field effect transistor includes an insulating layer, a gate electrode, a semiconductor layer including an inorganic material as described herein, a source electrode, and a drain electrode. The insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer.

For conductive layers, such as those used for the gate, source, and drain electrodes, useful materials include metals and conductive metal oxides. Examples of useful conductors include Al, Cr, Mo, Ag, aluminum doped ZnO (AZO), and indium doped tin oxide (ITO). The gate dielectric can be an inorganic gate dielectric, including for example, an insulating metal oxide such as aluminum oxide, HfO, ZrO, or SiO2. The inorganic semiconductor layer can be a metal oxide semiconductor, including for example, a ZnO based semiconductor. These layers of the TFT can be deposited using any method known in the art, including CVD, PECVD, sputtering or evaporation. ALD, and more specifically spatial ALD, is a useful method of deposition due to the low required processing temperature. The active layers can be patterned using methods including, selective area deposition (SAD), sequential masking, photolithography, laser, and/or other means known to the skilled artisan.

The embodiments of the present invention relate to thin film inorganic materials and devices that contain them. Example embodiments of the present invention use selective area deposition (SAD) in combination with atomic layer deposition (ALD). SAD employs a patterned material referred to as a "deposition inhibitor material", "deposition inhibiting material", or simply an "inhibitor" that inhibits the growth of a thin film material on the substrate when the substrate is subjected to an atomic layer deposition. Others have reported on using a selective area to generally pattern ALD coatings and more specifically to pattern a semiconductor layer. For example, Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. The use of SAD to pattern multilayer dielectric layers for use in electronic devices has been discussed in at least one of US Publication Nos. 20140065838, 20140065830, 20140061869, 20140061795, 20140061648 and U.S. Pat. Nos. 8,791,023; 8,846,545; and 8,653,516, the disclosures of which are incorporated by reference herein.

By inhibiting the growth where the deposition material is present, the deposition only deposits in regions (selective areas) of the substrate where the inhibitor is not present. The phrase "deposition inhibitor material" and its equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that may occur prior to depositing an inorganic thin film on the substrate by atomic layer deposition. A polymeric deposition inhibitor material may be crosslinked after applying the polymer onto the substrate, before or during the pattering step.

The deposition inhibitor material can be a compound or polymer that, after being applied, is subsequently polymerized, crosslinked, or polymerized and crosslinked. The deposition inhibitor material can be a compound or polymer that forms a self-assembled monolayer on the substrate. Polymers are preferably addition polymers such as, for example, a poly(perfluoroalkyl methacrylate); poly(perfluoroalkyl methacrylate); poly(methyl methacrylate); poly(cyclohexyl methacrylate); poly(benzyl methacrylate); poly (iso-butylene); poly(9,9-dioctylfluorenyl-2,7-diyl); polystyrene; poly(vinyl alcohol); poly(methyl methacrylate); poly(hexafluorobutyl methacrylate), and copolymers thereof, wherein the alkyl has one to six carbon atoms.

Crosslinking can be used to insolubilize a polymeric deposition inhibitor material after application onto the surface of the substrate. The crosslinking can occur prior to patterning or may occur during patterning in order to contribute to the patterning step, for example, by employing crosslinking initiated by, and patterned by, actinic radiation, followed by removal of non-crosslinked polymer, for example, by solvent.

The deposition inhibiting material layer includes one of a self-assembled monolayer, a polymer, and a water-soluble polymer. The self-assembled monolayer may be performed by exposing the substrate to a vapor, a liquid, or a liquid solution of a precursor material. The polymer may be soluble in any convenient solvent and may have any useful molecular weight, preferably in the range of 2,000 to 2,000,000. It may include a single functional group, or may include a plurality of functional groups. In the case of a plurality of functional groups, the polymer may be a random, periodic, or block polymer. Polymers soluble in polar solvents such as water, alcohols, or ketones are particularly preferred. Polymers may include amide groups, such as poly(amide), poly(vinylpyrollidone), and poly(2-ethyl-oxazoline). Polymers may include ether linkages, such as poly(ethylene glycol). Polymers may include alcohol functionalities, such as poly(vinyl alcohol). Polymers may include neutralized acid groups such as sodium poly(styrene sulfonate) and the sodium salt of poly(acrylic acid).

In some embodiments, the deposition inhibitor material is chosen specifically for the material to be deposited. The deposition inhibitor material has a given inhibition power. The inhibition power is defined as the layer thickness at or below which the deposition inhibitor material is effective. Preferably, the deposition inhibitor material, during use, exhibits an inhibition power of at least 50 Å, more preferably at least 100 Å, most preferably at least 300 Å. The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned form a patterned layer of the deposition inhibitor material. Pre-processing treatments for patterning the inhibitor include patterning of substrate prior to inhibitor application to modify the hydrophobicity, electric charge, absorption, or roughness of the substrate. Post processing treatments include light exposure, light exposure and subsequent liquid based development, and ablation.

Providing the patterned deposition inhibiting material layer on the substrate includes using at least one of an inkjet printing process, a flexographic printing process, a gravure printing process, and a photolithographic printing process. The active inhibiting material may be suspended or dissolved in a solvent or vehicle. The material may include surfactants, stabilizers, or viscosity modifiers. The printed material may be dried using natural convection, forced convection, or radiant heat. The material may be treated to change its morphology or chemical composition. A preferred chemical composition change is to crosslink the material. The change in morphology or chemical composition may be accomplished by exposure to a vapor phase or liquid phase reactant, or treatment with heat or light. Preferred processes include the crosslinking of material with ultra-violet (UV) light.

The process of making the thin films of the present invention can be carried out below a maximum support temperature of about 300° C., more preferably below 250° C., or even at temperatures near room temperature (about 25° C. to 70° C.). These temperatures are well below traditional integrated circuit and semiconductor processing temperatures and therefore enable the use of any of a variety of relatively inexpensive supports, such as flexible polymeric supports. Thus, the invention enables production of relatively inexpensive circuits containing thin film transistors with significantly improved performance.

The substrates used in the present invention can be any material that acts as a mechanical support for the subsequently coated layers. The substrate can include a rigid material such as glass, silicon, or metals. Particularly useful metals are stainless steel, steel, aluminum, nickel, and molybdenum. The substrate can also include a flexible material such as a polymer film or paper such as Teslin. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbomenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate any electric components such as thin film transistors. Nominally rigid materials that are flexible due to their thinness may also be used. These include glass at thicknesses below 200 μm and metals at thicknesses below 500 μm.

In some example embodiments, the substrate can include a temporary support or support material layer, for example, when additional structural support is desired for a temporary purpose, e.g., manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns may include patterns that modulate light transmission or electrical conductivity within or on the substrate. The patterns may include complete devices, circuits, or active elements existing on the substrate. The patterns may include portions of devices, circuits, or active elements awaiting subsequent processing steps for completion.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed is removed from the vacuum chamber. A second precursor is then applied to react with the first precursor on the substrate. The excess of the second precursor is removed from the vacuum chamber and the process is repeated.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice, as in any process, it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD processes as described, typically two molecular precursors are introduced into the ALD reactor in separate stages. Recently, a new ALD process has been developed which negates the need for a vacuum chamber. U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track. A spatially dependent ALD process, or spatial ALD (S-ALD), can be accomplished using one or more of the systems or methods described in more detail in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The preferred process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

A dielectric material is any material that is a poor conductor of electricity. Such materials typically exhibit a bulk resistivity greater than $10^{10}$ Ω-cm. Examples of dielectrics are $SiO_2$, HfO, ZrO, SiNx, and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide, indium zinc oxide, and gallium indium zinc oxide. The semiconductors may be doped to render them n-type or p-type, or to modulated the number of charge carriers present.

Metals that can be made using the process of the present invention include, but are not limited to: copper, tungsten, aluminum, nickel, ruthenium, and rhodium. It will be apparent to the skilled artisan that alloys of two, three, or more metals may be deposited, compounds may be deposited with two, three, or more constituents, and such things as graded films and nano-laminates may be produced as well.

These variations are simply variants using particular embodiments of the invention in alternating cycles. There are many other variations within the scope of the invention, so the invention is limited only by the claims that follow.

For various volatile zinc-containing precursors, precursor combinations, and reactants useful in ALD thin film processes, reference is made to the *Handbook of Thin Film Process Technology*, Vol. 1, edited by Glocker and Shah, Institute of Physics (IOP) Publishing, Philadelphia 1995, pages B1.5:1 to B1.5:16, hereby incorporated by reference, and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining acceptable performance when using preferred embodiments of the process of the present invention. Preferably, the present process can be accomplished using a spatial ALD process.

Two suitable approaches to combining patterning and depositing the semiconductor are described in US Patent Application Publication No. 2009/0081827 A1, published to Yang et al., on Mar. 26, 2009, the disclosure of which is hereby incorporated by reference in its entirety; and U.S. Pat. No. 8,017,183 B2, issued to Yang et al., on Sep. 13, 2011, the disclosure of which is hereby incorporated by reference in its entirety. Given that the preferred subsequent layers are deposited and conformally coated by atomic layer deposition (ALD), preferred deposition inhibitor materials are described in U.S. Pat. No. 7,998,878 B2, issued to Levy et al., on Aug. 16, 2011, the disclosure of which is hereby incorporated by reference in its entirety. In addition, deposition inhibitor materials are chosen to be compatible with printing on large flexible substrates in a low cost manner.

In some embodiments of the present invention, treating the surface prior to depositing a layer by ALD is an important process step. For the description that follows, the term "treating" can be taken to mean subjecting the substrate to a different environmental condition than that experienced during the ALD deposition. Treating can occur either within the ALD system, or preferably, the substrate is removed from the system and treated external to the system. Surface treatments include dry cleaning, such as a UV-ozone treatment, or a plasma, for example and preferably an oxygen plasma. Other treatments include wet clean steps, hold at ambient conditions, wet or dry etching the surface of a material layer, and other processes. An example cleaning process includes a liquid process using a solvent or a detergent. The liquid process may utilize a mechanical action such as brushing or wiping or pressure jets. The cleaning process can also be a vapor process. These processes include exposing the substrate to a vapor reactant that causes cleaning. The vapor exposure may include forms of energy to promote the process. These include light exposure, arcs, or plasmas. Particularly desired light exposures include UV exposure, especially in the presence of oxygen to produce ozone (UV-ozone). Plasmas include plasmas of various species including oxygen, chlorine, and fluorine. Plasmas created with these materials or with precursors that produce these materials are included in the present invention.

Turning now to the figures, FIG. 1a is a cross-sectional diagram of an embodiment of a TFT 100 of the present invention, taken along the line A-A' of the plan view shown in FIG. 1b. The TFT 100 shown in FIGS. 1a and 1b is a bottom gate structure having one embodiment of the variable thickness dielectric layer of the present invention. In this embodiment, TFT 100 has a gate 120 in contact with a substrate 110, a variable thickness dielectric stack 150 that is in contact with the gate 120, the substrate 110, and a semiconductor layer 170. The semiconductor layer 170 is in contact with a source electrode 180 and a drain electrode 185. TFT 100 shown in FIGS. 1a and 1b is a bottom gate structure, but it should be understood that transistors with a top gate structure composed of the same layers can be constructed and are considered an alternative embodiment of the present invention. A top gate TFT of the present invention has source and drain electrodes 180, 185 in contact with the substrate 110, a semiconductor layer 170 that is in contact with the source/drain 180,185 and the substrate 110, and a variable thickness dielectric stack 150 in contact with the semiconductor layer 170 and the gate 120.

As also shown in FIG. 1*b*, on substrate 110 there is a gate 120 including a first electrically conductive layer. The substrate 110 can be any previously discussed substrate, and may contain a plurality of predefined layers. The gate 120 has the conventionally accepted meaning, and is used to gate the current of the TFT 100. The first electrically conductive layer of the gate 120 may be a single conductive material, as shown in FIG. 1*a*, or may comprise any number of conductive material layers.

In order to keep the gate 120 isolated from the source and drain electrodes 180,185, a variable thickness dielectric stack 150 is disposed between them. Variable thickness dielectric stack 150 is made up of patterned first inorganic thin film dielectric material layer 130 and patterned second inorganic thin film dielectric material layer 140. The first inorganic thin film dielectric layer 130 has a first pattern and the second inorganic thin film dielectric layer 140 has a different second pattern. As shown in FIGS. 1*a* and 1*b*, the first pattern of the first dielectric layer 130 includes a portion having a via 814 over the gate in the channel region of the device (the gate via 814 indicates that layer 130 has no appreciable thickness), and portions between the source and drain electrodes 180,185 and the gate electrode 120 having a thickness. The second inorganic thin film dielectric layer 140 has a second pattern that is different from that of the first pattern, and has a uniform thickness over the gate 120, both in the area between the source and drain electrodes 180, 185 and the gate, and within the channel region of the TFT 100.

The combination of the patterns of first and second thin film dielectric layers 130, 140 form a dielectric stack 150 in contact with the gate 120 having first, second, and third regions, the first region in contact with the semiconductor layer 170 in the channel region and having a first thickness, the second region adjacent to the first region having the first thickness, and the third region adjacent to the second region having a second thickness greater than the first thickness. Plainly stated, the dielectric stack 150 provides a gate dielectric thickness that is thinner than the dielectric thickness in much of the overlap region between the source and drain electrodes 180,185 and the gate 120. Additionally, the size of the thinnest portion of the dielectric stack 150 located in the channel region can be independently sized from the other portions of the dielectric stack 150. It is preferable that, as shown, there is a second region adjacent to the channel with the same thickness as the gate dielectric portion to ensure that the source and drain electrodes 180, 185 contact the semiconductor layer 170 in the thinner region of dielectric thickness. This extension of the gate dielectric thickness region beyond the channel region defined by the gap between the source and drain electrodes 180, 185 provides for good carrier injection and for robustness for alignment in fabrication of the TFT 100 shown in FIGS. 1*a* and 1*b*.

In alternative embodiments, the first patterned inorganic thin film dielectric layer 130 can be formed in contact with the semiconductor layer 170, and the second patterned inorganic thin film dielectric layer 140 can be formed in contact with the substrate 110. This reversal of order of the first and second thin film dielectric layers 130, 140 results in an equivalent variable thickness dielectric stack 150. The first and second thin film dielectric layers 130, 140 can have different material compositions, or in a preferred embodiment the same material composition.

In embodiments where the patterned first inorganic thin film dielectric material 130 and patterned second inorganic thin film dielectric material 140 have the same material composition, the variable thickness dielectric stack 150 will not have the same analytical signature as a single layer with a combined thickness of the same material in the second region where the thickness of each layer is present (second thickness). The analytical signature is a consequence of forming the patterned first inorganic thin film dielectric material 130 in a separate step, and after at least a temporary change in environment, than the patterned second inorganic thin film dielectric material 140, resulting in an interface region between the first and second patterned inorganic dielectric layers 130 and 140. There will be a change in the intensity signal of either an impurity or compositional species in the interface region when compared to a region of the first inorganic thin film dielectric material layer 130 and the second inorganic thin film dielectric material layer 140 that is outside of the interface region. This intensity change acts as a marker indicating that an inorganic dielectric layer is indeed a variable thickness dielectric stack 150 and not a single layer of material that has been selectively etched to have different thicknesses. When an intensity signal for an impurity or compositional species in a contact area between the first inorganic thin film dielectric layer 130 and the second inorganic thin film dielectric layer 140 is 50% or greater than the intensity signal for the impurity or compositional species in a region of the first inorganic thin film dielectric layer 130 and the second inorganic thin film dielectric layer 140 that is outside of the contact region is detected, it serves as a marker indicating that an inorganic dielectric layer is not a single layer of material. The first inorganic thin film dielectric layer 130 and the second inorganic thin film dielectric layer each have an associated thickness. As shown in FIG. 1*a*, the thickness of the first inorganic thin film dielectric layer 130 and the thickness of the second inorganic thin film dielectric layer 140 are same. In alternative embodiments of the present inventions, these film thickness may be different. Additionally, one or both of the first and second thin film dielectric layers 130,140 can be formed of one or more dielectric layers.

FIGS. 1*a* and 1*b* show the relative location of the source and drain electrodes 180,185 on substrate 110. The source and drain have the conventionally accepted meaning, and either electrode shown may be designated the source (or drain) as is required by the application or circuit. The source and drain electrodes 180,185 are in a second electrically conductive layer. As with the first electrically conductive layer, the second electrically conductive layer can be a single conductive material, as shown in FIG. 1*a*, or alternatively can comprise any number of conductive material layers.

An advantage of the variable thickness dielectric layer 150 is that the size of the gate via 814 can be sized independently of the size and location of the other elements in the TFT 100. In prior art processes for forming transistors with variable thickness dielectric layers, the region of extra dielectric thickness between the overlap of the gate and source/drain layers is aligned, and most often self-aligned, with the source and drain. This use of an aligned structure results in the dielectric thickness immediately adjacent the channel region being thicker than the gate dielectric thickness in the channel. As a consequence, prior art uses of extra dielectric thickness in the overlap between the gate and the source/drain have been limited to top gate architectures. This limitation is a functional limitation; if a self-aligned extra dielectric portion was used in a bottom gate architecture, it would prevent good charge injection into the semiconductor since the region of contact of the source and drain with the semiconductor would be separated from the gate by a dielectric having a thickness greater than the gate dielectric thickness. Another advantage of the present invention is that the variable thickness dielectric layer 150 can be implemented in any TFT architecture bottom gate or top gate, with or without staggered contacts.

FIG. 2 is a cross-sectional diagram of an alternative embodiment of a TFT 102 of the present invention, taken along the line A-A' of the plan view shown in FIG. 1b. The TFT 102 shown in FIG. 2 is a bottom gate structure similar to TFT 100 shown in FIG. 1a, and also has a gate 120 in contact with the substrate 110 and a variable thickness dielectric stack 152. The variable thickness dielectric stack 152 is in contact with the gate 120, the substrate 110, and the semiconductor layer 170. The semiconductor layer 170 is in contact with the source electrode 180 and the drain electrode 185. The substrate 110, gate 120, semiconductor layer 170, and source and drain electrode 180,185 should be understood from the previous description of FIGS. 1a and 1b.

The variable thickness dielectric stack 152 shown in FIG. 2 serves the same function and has the same defining features as the variable thickness dielectric stack 150 shown in FIG. 1a. The dielectric stack 152 is in contact with the gate 120 and has first, second, and third regions, where the first region is in contact with the semiconductor layer 170 in the channel region and has a first thickness, the second region is adjacent to the first region and also has the first thickness, and the third region that is adjacent to the second region having a second thickness greater than the first thickness. As discussed with respect to FIG. 1a, this feature of variable thickness provides a thicker dielectric where the source and drain electrodes 180, 185 overlap the much of gate 120, including the gate edge, reducing the potential for shorting and decreasing the gate leakage. The thinner dielectric over the gate 120 in the channel region of the device controls the electrical field experienced in the semiconductor layer 170 when the gate 120 is activated. The additional dielectric buffer layer 160 in dielectric stack 152 serves to control the interface between the semiconductor layer 170 and the gate dielectric 152, which is known to be critical to the function of the TFT 102. In TFTs that are formed by the combination of SAD and ALD, special care should be taken to insure that the interface between the semiconductor and the gate dielectric is not disturbed by the removal of the deposition inhibiting material. As shown in FIG. 2, the dielectric buffer layer 160 has the same pattern as the semiconductor layer 170 and is in contact with the semiconductor layer 170. The additional dielectric buffer layer 160 can be a different material from the other layers in the variable thickness dielectric stack 152. Preferably, all of the layers of the variable thickness dielectric stack 152, including the additional dielectric buffer layer 160, have the same material composition. As discussed above, although each layer is formed of the same material, when the layers are formed in separate steps the interfaces between the layers can be detected by a change in the intensity signal of either an impurity or compositional species.

Variable thickness dielectric stack 152 is made up of patterned first inorganic dielectric layer 130, patterned second dielectric layer 140, and the additional dielectric buffer layer 160. The first inorganic thin film dielectric layer 130 has a first pattern and the second inorganic thin film dielectric layer 140 has a second pattern. As shown in FIGS. 1a and 1b, the first pattern of the first dielectric layer 130 includes a portion having a via 814 over the gate 120 in the channel region of the device (the via indicates that layer 130 has no appreciable thickness) and other portions of the pattern between the source and drain electrodes 180,185 and the gate electrode 120 have a larger thickness. The second inorganic thin film dielectric layer 140 has a pattern that is different from that of the first pattern, and has a uniform thickness over the gate, both in the area where the source and drain electrodes 180,185 overlap the gate 120 and within the channel region of the TFT 102. The additional dielectric buffer layer 160 has a uniform thickness in the area of the semiconductor pattern. Plainly stated, the variable thickness dielectric stack 152 provides a gate dielectric thickness that is thinner than the dielectric thickness in much of the overlap region between the source and drain electrodes 180,185 and the gate 120. Additionally, the thinnest portion of the dielectric stack in the channel region can be independently sized from the other portions of the dielectric stack 152. It is preferable that, as shown, there is a second region adjacent to the channel having the same thickness as the gate dielectric within the channel region to ensure that that the source and drain electrodes 180,185 contact the semiconductor layer 170 in a region of proper dielectric thickness; as shown in FIG. 2 this thickness is equal to the combined thickness of the second dielectric layer 140 and the additional dielectric buffer layer 160. This extension of the gate dielectric thickness region beyond the channel region defined by the gap between the source and drain electrodes 180,185 enables good charge injection and also robust alignment when fabricating the TFT 102 shown in FIGS. 2 and 1b. In alternative embodiments, the first patterned dielectric layer 130 is formed in contact with the additional dielectric buffer layer 160, and the second patterned inorganic thin film dielectric layer 140 is formed in contact with the substrate 110. This reversal of order of the first and second thin film dielectric layer results 130, 140 in an equivalent variable thickness dielectric stack 152.

Figure 3:
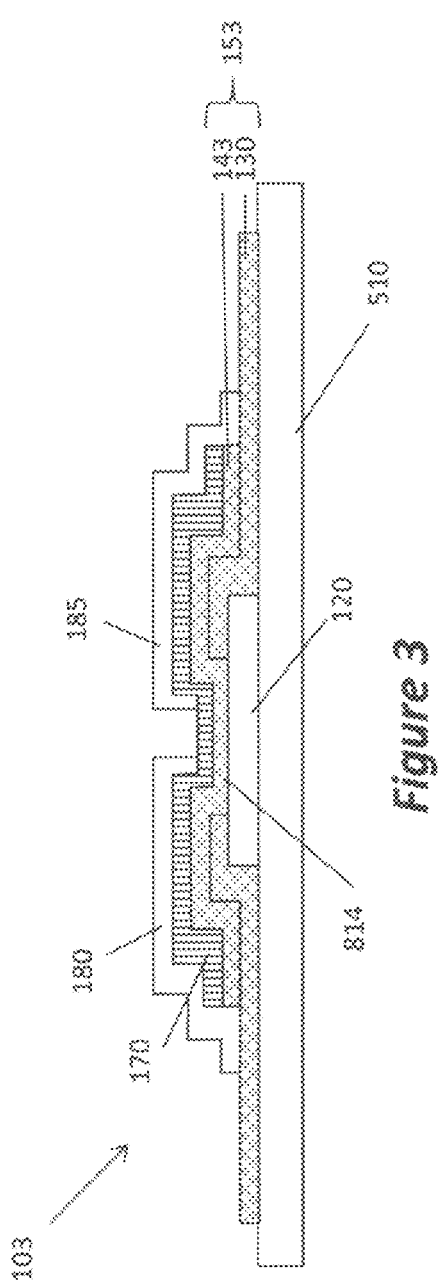
FIG. 3 is a cross-sectional view of an embodiment of a bottom gate TFT with a buffer layer included in an example embodiment of a variable thickness dielectric stack of the present invention.

FIG. 3 is a cross-sectional diagram of an alternative embodiment of a TFT 103 of the present invention, taken along the line A-A' of the plan view shown in FIG. 1b. The TFT 103 shown in FIG. 3 is a bottom gate structure similar to TFT 100 shown in FIG. 1a, and also has a gate 120 in contact with the substrate 110, and has a variable thickness dielectric stack 153. The variable thickness dielectric stack 153 is in contact with the gate 120, the substrate 110, and the semiconductor layer 170. The semiconductor layer 170 is in contact with the source electrode 180 and the drain electrode 185. As shown in FIG. 3, the substrate 110, gate 120, semiconductor layer 170, and source and drain electrode 180,185 should be understood from the previous description of FIGS. 1a and 1b.

The TFT 103 of FIG. 3 illustrates an embodiment of the present invention wherein the interface between the dielectric layer 153 and the semiconductor layer 170 is controlled by dielectric buffer layer 143, and the thickness of the dielectric buffer layer 143 is the same as the thickness of the gate dielectric in the channel region. The first inorganic thin film dielectric layer 130 has a first pattern and the dielectric buffer layer 143 has a second pattern. In the embodiment of TFT 103, the dielectric buffer layer 143 is a second patterned dielectric layer. The first pattern of the first dielectric layer 130 includes a portion over the gate in the channel region of the device with no thickness (i.e. gate via 814), and other portions of the pattern between the source and drain electrodes 180,185 and the gate electrode 120 having a larger thickness. The dielectric buffer layer 143 has a second pattern that is different from that of the first pattern and has a uniform thickness in the area between the source and drain electrodes 180, 185 and the gate 120 within the channel region of the TFT 103. As shown in FIG. 3, the second pattern is the same as the pattern of the semiconductor layer 170. The combination of the patterns of first and second thin film dielectric layers 130, 143 form a dielectric stack 153 in contact with the gate 120 having first, second, and third regions, the first region in contact with the semiconductor layer 170 in the channel region and having a first thickness, the second region adjacent to the first region having the first thickness, and the third region adjacent to the second region having a second thickness greater than the first thickness. Plainly stated, the dielectric stack 153 provides a gate dielectric thickness in the channel region that is thinner than the dielectric thickness in much of the overlap region between the source and drain electrodes 180,185 and the gate 120.

In the embodiment shown in FIG. 3, the dielectric buffer layer 143 is in contact with both the gate 120 and the semiconductor layer 170. It is useful to independently set the thickness of the gate dielectric from the portions of the variable thickness dielectric stack 153. It is preferable that, as shown, there is a second region adjacent to the channel with the same thickness as the gate dielectric portion to ensure that that the source and drain electrodes 180, 185 contact the semiconductor layer 170 in a region of proper dielectric thickness. This extension of the gate dielectric thickness region beyond the channel region defined by the gap between the source and drain electrodes 180, 185 enables good charge injection and also robust alignment during fabrication of the TFT 103.

FIGS. 4a, 4b, and 4c serve to more clearly illustrate the critical features of the variable thickness dielectric stack 150 and the regions referred to above. The region of the transistor that lies over the gate 120 along a direction parallel to the length of the transistor is shown in plan view in FIGS. 4a and 4b and in cross section in FIG. 4c. The plan views of FIGS. 4a and 4b extend to the length of the gate. As shown, the transistor has a gate 120, the gate 120 having a gate length 425. The source and drain electrodes 180,185 are separated by a gap defining a channel region, and the channel region has a channel length 455 that is less than the gate length 425. The semiconductor layer 170 is in contact with the source and drain electrodes 180, 185. As shown in FIG. 4b, the semiconductor layer 170 has a length 475 greater than the gate length 425 and extends beyond the gate 120. This feature of the semiconductor layer 170 is useful to provide alignment tolerance in the fabrication process and further protects the source and drain electrodes 180,185 from shorting to the gate 120.

There are three distinct regions of the dielectric stack illustrated in FIGS. 4b and 4c, the channel region 450, a first region 460 adjacent to the channel region 460, and a second region 470 adjacent to the first region 460 and opposite the channel region 450. The channel region 450 is within the channel of the TFT 100 and the thickness of the variable thickness dielectric layer is the gate dielectric thickness which will determine the performance of the TFT 100 by defining the capacitance $C_{ox}$ of Equation (1). The first region 460 includes the area where the source and drain electrodes 180, 185 make contact to the semiconductor layer 170 adjacent to the channel region 450. The dielectric thickness in the first region 460 is the same as the thickness in the channel region 450. Additionally, the dielectric in the first region 460 and the dielectric in the channel region 450 are formed from the same dielectric layer or layers, and as such have the same composition. This extension of the gate dielectric thickness beyond the channel region 450 provides manufacturing robustness for TFT 100, and also is beneficial to device performance by ensuring good contact and charge injection. As shown in FIGS. 4b and 4c, in some embodiments the dielectric in the first region 460 and the dielectric in the channel region 450 are defined by via 814 in the first patterned dielectric layer 130, and the length 465 of via 814 is greater than the channel length 455 and less than the length 425 of the gate 120. Farther away from the channel region 450, the dielectric in the second region 470 is thicker than that of the dielectric in the channel region 450. The thickness in the second region 470 is equal to the maximum thickness of the variable thickness dielectric stack 150, which is equal to the sum of the thicknesses of all of the layers of the variable thickness dielectric stack 150. The second region 470 is over a portion of the gate 120, and provides protection against shorting of the source and drain electrodes 180,185 to the gate 120. The additional dielectric thickness in the second region 470 also reduces the parasitic capacitance of the TFT 100. Furthermore, the second region 470 can reduce the gate leakage. The variable thickness dielectric stack 150 can be made up of at least two layers, and as many additional dielectric layers as desired. In some embodiments, as shown in FIG. 2, the variable thickness dielectric stack 150 has three layers. Preferably the variable thickness dielectric stack 150 has fewer than ten layers. The variable thickness dielectric stack 150 can have other regions outside of the area of the TFT 100 with thickness that are different from that of the first region 460 or the second region 470. The variable thickness dielectric stack 150 can be shared between multiple devices over a single substrate. The descriptions of variable thickness dielectric stack 150 should also aid in the understanding of the alternative embodiments 152, 153 shown in FIGS. 2 and 3.

Figure 5:
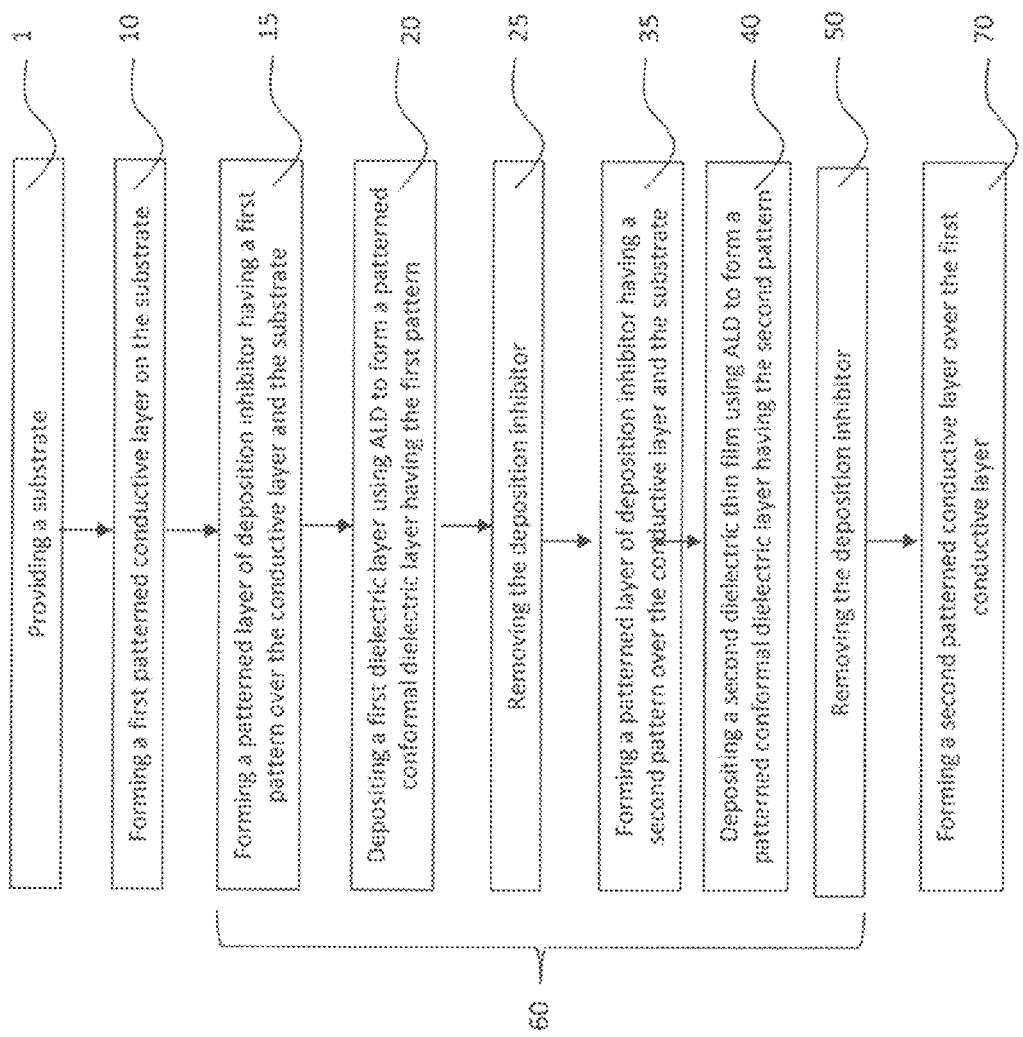
FIG. 5 is a flow chart describing the steps of an example embodiment of a process for forming the variable thickness dielectric.

Turning now to FIG. 5, a diagrammatic Step diagram is shown for one embodiment of a process of the present invention for making a variable thickness dielectric stack using a combination of selected area deposition (SAD) and ALD. The process for making a variable thickness dielectric stack includes the steps of providing a substrate; forming a first patterned conductive layer on the substrate; forming a first patterned deposition inhibitor layer having a first pattern over the conductive layer and the substrate; depositing a first dielectric thin film using ALD to form a first patterned conformal dielectric layer having the first pattern; removing the first patterned deposition inhibitor layer; forming a second patterned deposition inhibitor layer having a second pattern over the conductive layer and the substrate; depositing a second dielectric thin film using ALD to form a second patterned conformal dielectric layer having the second pattern; and forming a second patterned conductive layer. At least a portion of the first patterned conductive layer and a portion of the second patterned conductive layer overlap each other forming an overlap region. A portion of the first pattern or a portion of the second pattern extending into the overlap region such that a first portion of the overlap region includes the first and the second dielectric thin films and a second portion of the overlap region includes only one of the first or second dielectric thin films.

Figure 6D:
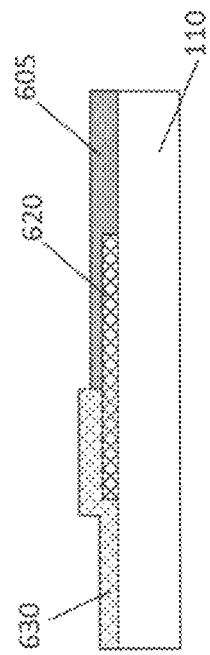
Figure 6E:
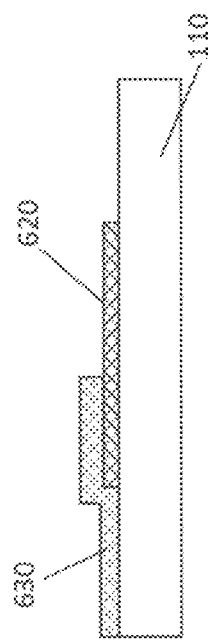
Figure 6A:
Figure 6B:
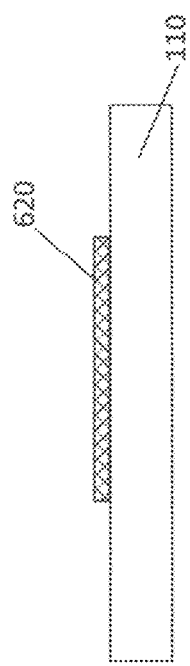

Each Step is now examined in more detail, and may be better understood by reference to the illustrative descriptive build shown in cross-sectional views in FIGS. 6a-6i. In Step 1 of FIG. 5, as illustrated in FIG. 6a, a substrate is supplied into the system. As previously described, the substrate can be any substrate that is suitable for the process and can contain any number of preexisting layers. In Step 10 of FIG. 5, as illustrated in FIG. 6b a first patterned conductive layer is formed on the substrate. The first patterned conductive layer can be formed from any practically processable conductive material, including metals and conductive metal oxides. The first patterned conductive layer can be formed using any method known in the art, including photolithography and selective area deposition. In a preferred embodiment, the first patterned conductive layer is a patterned transparent conductive oxide (TCO). In other preferred embodiments, forming the first patterned conductive layer includes using selective area deposition in combination with spatial ALD.

Figure 6C:
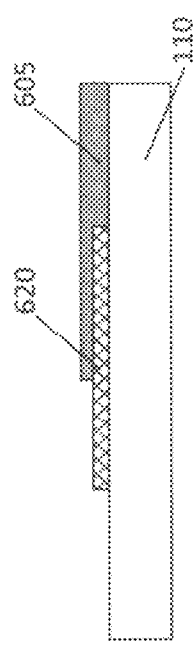

In Step 15 of FIG. 5, as illustrated in FIG. 6*c*, a patterned layer of deposition inhibitor having a first pattern is formed over the conductive layer and the substrate. The deposition inhibitor material can generically be any material that causes the material deposition to be inhibited and should be understood from the previous descriptions. In one embodiment, the deposition inhibitor material is chosen specifically for the material to be deposited. In other embodiments, the deposition inhibitor material has a given inhibition power. The inhibition power is defined as the layer thickness at or below which the deposition inhibitor material is effective. In some embodiments, the patterned layer of deposition inhibitor is formed in Step 15 using an additive patterning method, such as using inkjet, flexography, gravure printing, microcontact printing, offset lithography, patch coating, screen printing, or transfer from a donor sheet. A preferred inhibitor for additive patterning methods is polyvinyl pyrrolidone (PVP). In an alternative embodiment, patterned layer of deposition inhibitor is formed by coating a uniform layer of the deposition inhibitor material patterning using photolithographic techniques. A preferred inhibitor for photolithographic patterning is polymethylmethacrylate (PMMA). As shown in FIG. 6*c*, the first pattern of the first pattern deposition inhibitor layer 605 contains regions where deposition inhibitor is not present. As shown FIG. 6*c*, the first pattern has a portion of pattern that overlaps the first patterned conductive layer 620.

Continuing with FIG. 5, Step 20, as illustrated in FIG. 6*d*, deposits the desired first dielectric layer 630 by an Atomic Layer Deposition (ALD) process. This deposition can be using any ALD system, preferably a spatial ALD system. The dielectric layer is deposited only in the areas of the substrate where there is no deposition inhibitor material, and forms a patterned conformal dielectric layer having the first pattern. As used herein, patterned layers formed using SAD are said to have the same pattern as the layer of deposition inhibitor. This usage indicates that the patterns have the same x-y features, and it should be understood that the inorganic layer is formed in the opposite portion of the pattern than where the inhibitor is present. After the first patterned dielectric layer 630 is deposited in Step 20, the deposition inhibitor 605 is removed in Step 25 of FIG. 5, as illustrated in FIG. 6*e*, by a surface treatment that simultaneously cleans the surface of the first patterned dielectric layer. Surface treatments include dry cleaning, such as a UV-ozone treatment, or gas plasma, preferably an oxygen plasma. Other treatments include wet clean steps.

A second patterned layer of deposition inhibitor 615 having a second pattern is formed over the conductive layer and the substrate in Step 35 of FIG. 5, as illustrated in FIG. 6*f*. As in Step 15, the deposition inhibitor material 615 may be deposited in a patterned manner using a printing technique, or as a uniform layer that is patterned using photolithography. At least the first pattern or the second pattern has a region over the first conductive layer where there is deposition inhibitor present. As illustrated in FIG. 6*f*, the second patterned deposition inhibitor layer 615 has a second pattern that is different from the first pattern of the first patterned deposition inhibitor material layer 605. The second patterned deposition inhibitor layer 615 has regions where the inhibitor material is not present. In preferred embodiments, the first patterned layer of deposition inhibitor and the second patterned layer of deposition inhibitor are formed using the same process with the same inhibitor material.

After providing the second patterned deposition inhibitor material layer 615 on the substrate, a second dielectric layer 640 is deposited by ALD in Step 40 of FIG. 5, as illustrated in FIG. 6*g*. The second thin film dielectric material 640 may be the different from that of the first thin film dielectric material 630, or preferably the same as that of the first thin film dielectric material. The layer thickness of the first and second thin film dielectric material may be the same or different. After depositing the second thin film dielectric material, the deposition inhibitor material 615 is removed in Step 50 of FIG. 5, as illustrated in FIG. 6*h*, using any of the processes discussed with respect to Step 25. The patterned first inorganic dielectric layer 630 and patterned second inorganic dielectric layer 640 in combination form the variable thickness dielectric stack 650 as illustrated in FIG. 6*h* after the inhibitor was removed in Step 50. The Steps 15 through 50 shown in FIG. 5 can be considered as a single Step 60, which is a process block to form a variable thickness dielectric stack.

In Step 70, after removing the deposition inhibitor 615, a second patterned conductive layer 680 is formed over at least part of the first conductive layer 620 and the variable thickness dielectric stack 650, as illustrated in FIG. 6*i*. The second patterned conductive layer 680 has a portion that overlaps at least a portion of the first patterned conductive layer 620 to form an overlap region. A portion of the first pattern or a portion of the second pattern extends into the overlap region such that there are at least two portions of the overlap region: a first portion of the overlap region that includes both the first and the second dielectric layers, and a second portion of the overlap region that includes only one of the first or second dielectric layers. As illustrated in FIG. 6*i*, the variable thickness dielectric stack 650 is disposed between the first patterned conductive layer 620 and the second patterned conductive layer 680. The first patterned conductive layer 620 and the second patterned conductive layer 680 overlap to form an overlap region 675. The overlap region has two portions 690 and 695. The first portion 690 of the overlap region 675 includes the thickness of both of the first and the second dielectric layers 630, 640, while the second portion 695 of the overlap region 675 includes only the thickness of the second patterned dielectric layer 640 as shown in FIG. 6*i*. The two portions 690, 695 of the variable thickness dielectric stack 650 within the overlap region are a result of the differences in the first and second patterns of the deposition inhibitor. Although as illustrated in FIGS. 6*a*-6*i*, the second portion 695 includes only the second dielectric layer 640, alternative embodiments having only the first dielectric layer 630 present in the second portion 695 are easily obtained by selecting the first and second patterns appropriately.

The process flow described in FIG. 5 is useful to make any number of electronic and optoelectronic elements. For example, a capacitor is a logical result of the process in FIG. 5 having a dielectric stack between two conductors. A transistor results from the addition of a semiconductor layer between the two conductive layers, and appropriate patterning of the two conductors.

Figure 7:
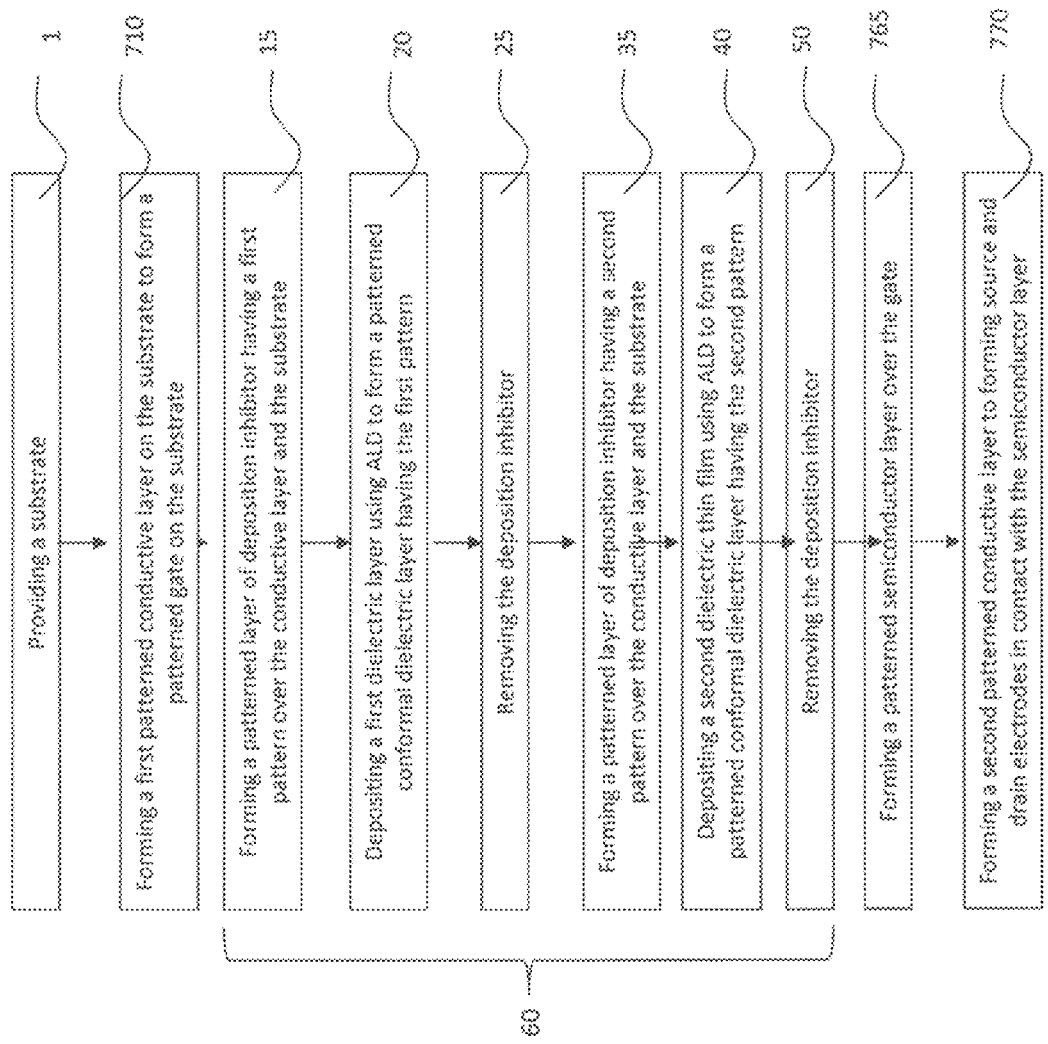
FIG. 7 is a flow chart describing the steps of an example embodiment of a process for forming a bottom gate TFT with a variable thickness dielectric.

FIG. 7 is a variation of the diagrammatic Step diagram shown in FIG. 5, illustrating one embodiment of a process of the present invention for making a variable thickness dielectric stack as part of a thin film transistor. Step 1 provides a substrate. In Step 710 a patterned gate is formed on the substrate. This is a more specific embodiment of FIG. 5 that forms the first patterned conductive layer in Step 10.

Step 60, forming a variable thickness dielectric stack, as defined by Steps 15 through 50, is the same for FIGS. 5 and 7 and should be understood from the previous descriptions. After forming the variable thickness dielectric stack a patterned semiconductor layer is formed over the gate in Step 765. The variable thickness dielectric stack is disposed between the semiconductor layer and the gate. After forming the semiconductor layer, the source and drain electrodes are formed in Step 770. Step 770 is a more specific embodiment of step 70 of FIG. 5, namely forming the second conductive layer. The source and drain electrodes are separated by a gap which defines a channel region. As shown in FIG. 7, Step 765 forming a patterned semiconductor layer over the gate, places the semiconductor patterned layer between the first patterned conductive layer and the second patterned conductive layer, i.e. between the gate and the source and drain electrodes.

As with the first and second conductive layers of FIG. 5 and FIG. 6, the source and the drain electrode each have a portion that overlaps at least a portion of the gate to form an overlap region; this overlap region is adjacent to the channel region. There are at least two portions of the overlap region: a first portion of the overlap region that includes both the first and the second dielectric layers, and a second portion of the overlap region which includes only one of the first or second dielectric layers. In the process of FIG. 7, the second portion of the overlap region having only one of the first or second dielectric layers is adjacent to the channel region, and this second portion of the overlap region is between the channel region and the first portion of the overlap region. The channel region and the second portion of the overlap region have the same thickness. The first portion of the overlap region is further from the channel including both the first and the second dielectric layers, and is useful to prevent against the source or drain electrode shorting to the gate.

FIG. 7 uses the process flow of FIG. 5 to describe forming a staggered bottom gate structure where the gate is in contact with the substrate, and the semiconductor layer is under the source and drain electrodes. It should be clear that the process flow of FIG. 5, with the additional step of forming a patterned semiconductor layer, can be used for any thin film transistor structure including a non-staggered bottom gate structure where the gate is in contact with the substrate and the semiconductor is over the source and drain electrodes. The process is also useful for forming top gate structures, where the source and drain electrodes are in contact with the substrate and the semiconductor. Top gate architectures with the semiconductor layer over or under the source and drain electrodes are equally easy to obtain using the process described herein.

FIGS. 8a and 8b through 23a and 23b are descriptive process build figures for the process flow shown in FIG. 7 to form a bottom gate TFT having a variable thickness dielectric stack. It should be understood from the previous descriptions that other architectures with the variable dielectric stack are also obtainable using this method by changing the order of forming the patterned layers.

FIG. 8a is a cross-sectional diagram for processing Step 10 to form one embodiment of a TFT 100 of the present invention, taken along the line A-A' of the plan view shown in FIG. 8b. As shown in FIGS. 8a and 8b, an electrically conductive gate 120 is formed on a substrate 110. In the Example TFTs of the present invention, the gate 120 was provided using the combination of SAD and ALD forming a gate having 1000 A of AZO as the conductive layer. The gate 120 can be provided using any method known in the art, including using a selective area deposition process. In other embodiments of Step 10, a conductive material can be deposited uniformly and patterned using standard photolithographic techniques. In other embodiments the gate 120 can be formed by directly printing a conductor.

A first patterned deposition inhibitor layer 810 is provided on substrate 110 as shown in FIGS. 9a and 9b, and contains regions 820 where the deposition inhibiting material layer is not present. The patterned deposition inhibitor can be provided by uniformly coating a deposition inhibitor material and patterning using photolithography. In preferred embodiments, the patterned deposition inhibitor layer 810 is formed by a printing method. In other preferred embodiments, the deposition material is polyvinyl pyrrolidone (PVP). The pattern of the first patterned deposition inhibitor 810 has a contact via portion 822 over the pad of the TFT gate 120 and a gate via portion 824 in the region of the gate where the channel of the TFT will be formed. Both the contact via portion 822 and the gate via portion 824 are formed by the portions of first pattern where the deposition inhibitor is present.

Figure 10A:
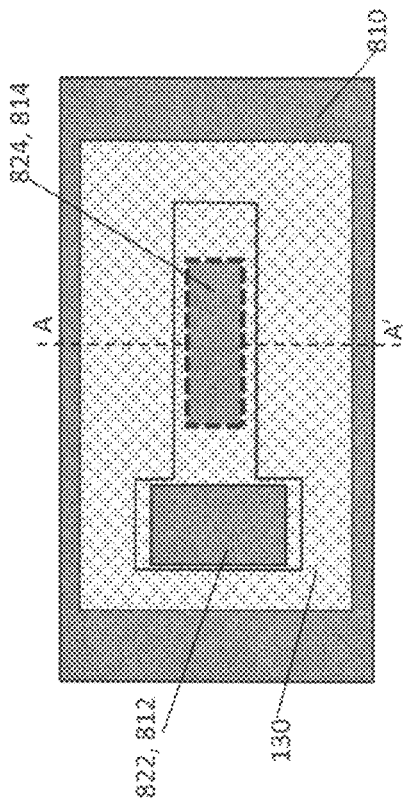
Figure 10B:
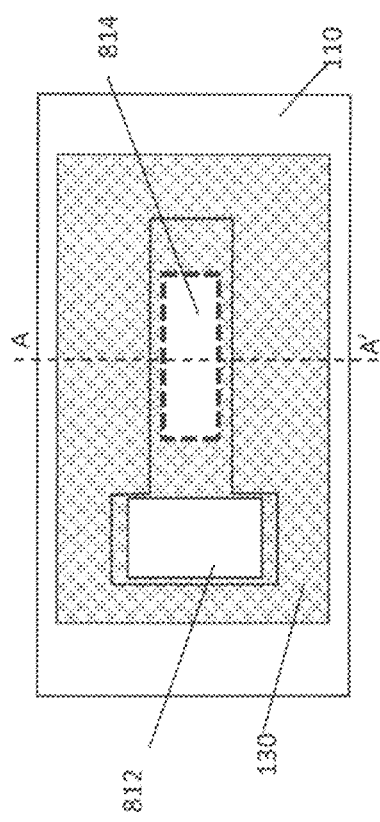

Next, as shown in FIGS. 10a and 10b, a first patterned dielectric layer 130 is obtained by selectively depositing an inorganic dielectric material in the region 820 of the substrate where inhibitor is not present using an atomic layer deposition process. The first patterned dielectric layer 130 covers a portion of the gate 120 of the TFT, and may be of any pattern that has this feature. As shown the first patterned dielectric layer 130 has a contact via 812 and a gate via 814. The dielectric layer can be of any composition, but is preferably a metal oxide, more preferably $Al_2O_3$. The atomic layer deposition process is preferably a spatial ALD process. As indicated above, when using SAD the inorganic layer has the same pattern as the inhibitor used to pattern it, with the occupied regions of the pattern inverted. As such, the first patterned dielectric layer 130 has the same first pattern as the first patterned inhibitor layer 810. In particular the patterned dielectric layer 130 is formed by growing the dielectric material in the regions 820 of the first patterned inhibitor layer 810 where the inhibitor is absent.

Figure 11A:
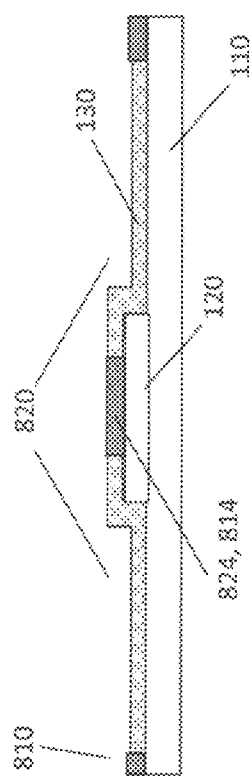
Figure 11B:
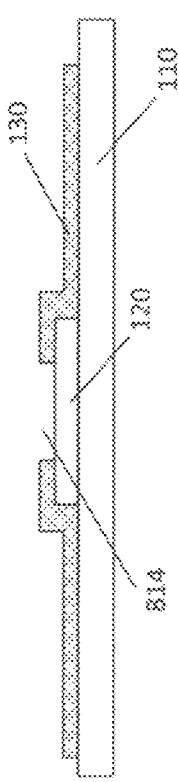

Following the selective deposition of the first patterned dielectric layer 130, the first patterned deposition inhibitor layer 810 is removed as in Step 25. The result of Step 25 is shown in FIGS. 11a and 11b. In one preferred embodiment, the first patterned deposition inhibitor layer 810 is removed by simultaneously treating the first deposition inhibiting material layer 810 and the first patterned dielectric layer 130. The removal can be accomplished by a wet process, such as a solvent rinse, or a dry process such as a plasma process or UV-ozone process. The removal preferably uses a plasma process, more probably an $O_2$ plasma process.

Figure 12A:
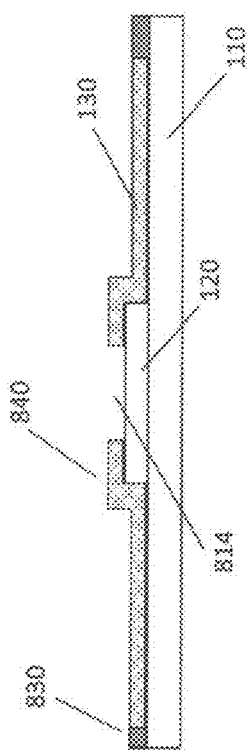
Figure 12B:
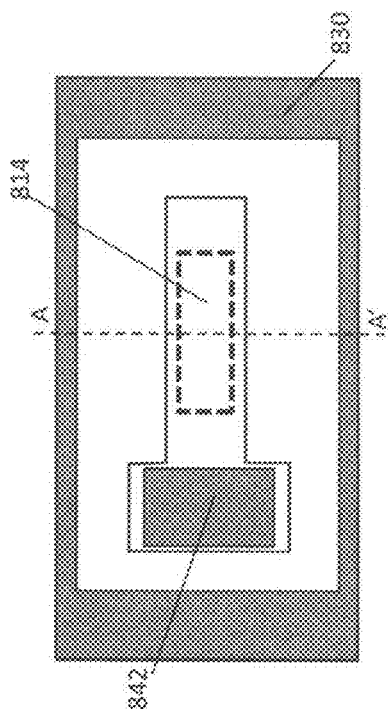

Next, a second patterned deposition inhibitor layer 830 is provided on substrate 110 in Step 35, as shown in FIGS. 12a and 12b. Preferably, the second patterned deposition inhibitor layer 830 is provided using the same method as the first patterned deposition inhibitor layer 810. The second patterned deposition inhibitor layer 830 has a second pattern that is different from the first pattern of the first patterned deposition inhibitor layer 810. The second patterned deposition inhibitor layer 830 and the first patterned deposition inhibitor layer 810 have a common feature of a contact via portion 842, having a contact via portion is required in all layers of the variable thickness dielectric layer 150 where contact between different conductive layers is desired. As shown in FIGS. 12a and 12b, the second pattern does not have a gate via 814, and instead a portion of the regions 840 where the deposition inhibitor layer is not present is located over the gate 120.

Figure 13A:
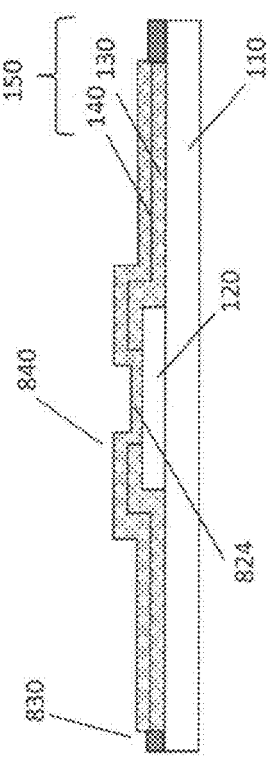
Figure 13B:
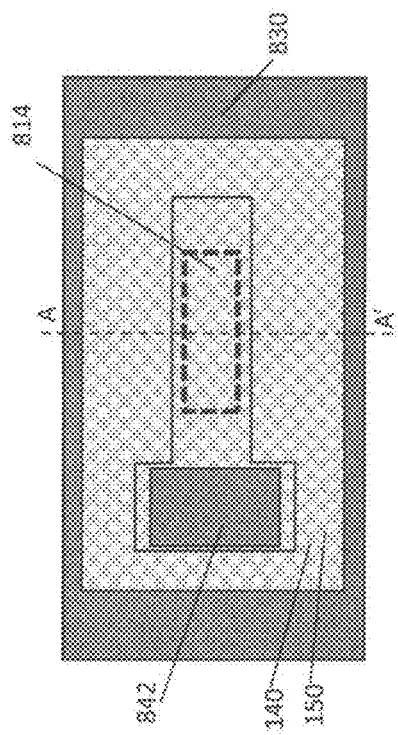

Next, as shown in FIGS. 13a and 13b, a patterned second inorganic thin film dielectric layer 140 is formed as in Step 40 by selectively depositing an inorganic dielectric material in the region 840 of the substrate 110 where the second deposition inhibitor material is not present using an atomic layer deposition process. The second patterned dielectric layer 140 has the second pattern of the second deposition inhibitor layer 830. As noted above, the second pattern and the first patterns are different. The second patterned dielectric layer 140 can have the same or different material composition than the first patterned dielectric layer 130. Preferably the first patterned dielectric layer 130 and the second patterned dielectric layer 140 are formed from the same material, and have the same material composition. Preferably, the second patterned dielectric layer 140 is an insulating metal oxide, preferably alumina. The variable thickness dielectric stack 150 as shown is made up of first patterned dielectric layer 130 and second patterned dielectric layer 140. The first patterned dielectric layer 130 and second patterned dielectric layer 140 can have the same layer thickness, or different thicknesses. One or both of the first patterned dielectric layer 130 and second patterned dielectric layer 140 can be formed of multiple individual layers having the same pattern by performing SAD patterning steps. In alternative embodiments, additional patterned dielectric layers having patterns that are different from either the first or second patterns can be used in forming variable thickness dielectric stack 150.

Following the selective deposition of the second patterned dielectric layer 140, the second patterned deposition inhibitor layer 830 is removed as in Step 50. The resultant structure of the inhibitor removal is shown in FIGS. 14a and 14b. The removal processes should be understood from the previous descriptions, and is preferably an O$_2$ plasma process.

Next, a patterned semiconductor layer is formed in Step 765. The patterned semiconductor layer 170 can be formed using any method known in the art, including depositing a uniform layer of semiconductor material and patterning using photolithography. The semiconductor is preferably a metal oxide semiconductor, preferably an n-type metal oxide semiconductor. Preferably the n-type metal oxide semiconductor is a ZnO-base material, ZnO or IGZO for example. In some embodiments the patterned semiconductor layer can be formed using a selective area deposition process. When using a selective area deposition process, a third patterned deposition inhibitor layer 850 is provided on substrate 110 and contains regions 860 where the deposition inhibitor material is not present as shown in FIGS. 15a and 15b. Preferably, the third patterned deposition inhibitor layer 850 is provided using the same method as the first patterned deposition inhibitor layer 810.

Figure 16B:
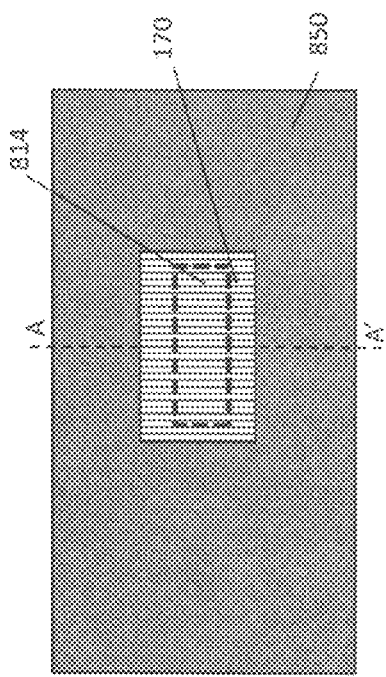
Figure 17B:
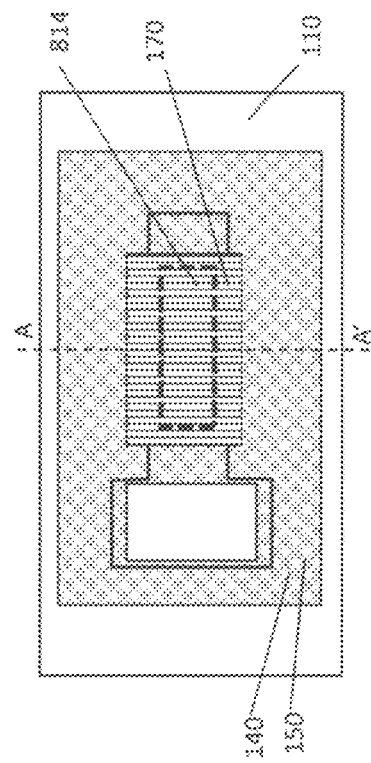
Figure 16A:
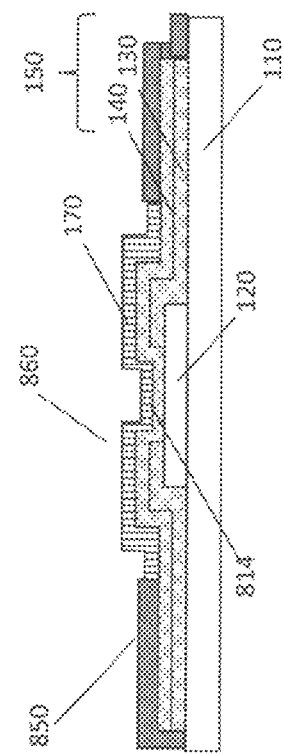
Figure 17A:
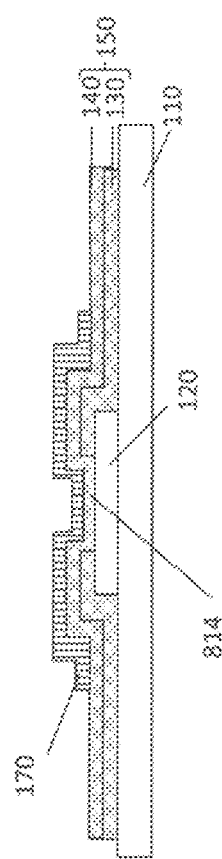

As shown in FIGS. 16a and 16b the patterned semiconductor layer 170, is obtained by selectively depositing an inorganic semiconductor material in the region 860 of the third deposition inhibitor layer 850 where the deposition inhibitor is not present using an atomic layer deposition process. As shown, the patterned semiconductor layer 170 has the same pattern as the third patterned deposition inhibitor layer 850. Following the selective deposition of the second patterned dielectric layer 140, the third patterned deposition inhibitor layer 850 is removed. The resultant structure of the inhibitor removal is shown in FIGS. 17a and 17b. The removal processes should be understood from the previous descriptions, and is preferably an O$_2$ plasma process. The structure shown in FIGS. 17a and 17b is the result of process Step 765, forming the patterned semiconductor layer 170.

In some alternative embodiments, the third deposition layer 850 is used to form a patterned third dielectric layer, or a buffer layer, as shown in TFT 102 of FIG. 2. The patterned dielectric buffer layer 160 is formed after forming the third deposition inhibitor layer 850 and prior to selectively depositing the semiconductor layer 170 by selectively depositing a dielectric material using an atomic layer deposition process (not shown). The patterned dielectric buffer layer 160 has the same pattern as the patterned semiconductor layer 170, as shown in FIG. 2.

Figure 18A:
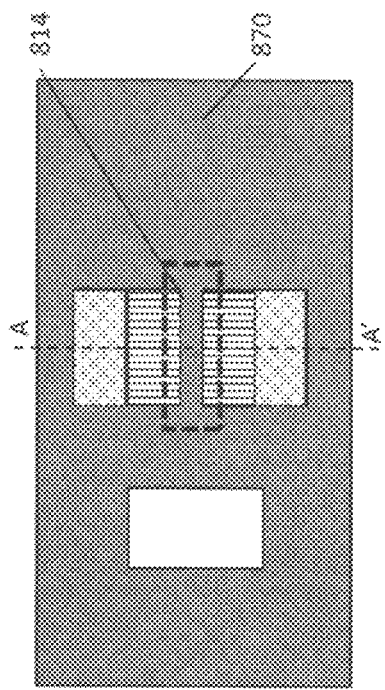
Figure 18B:
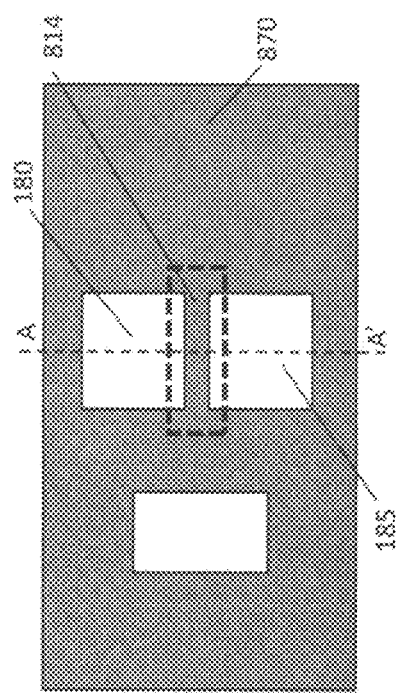

Next, a second patterned conductive layer is formed in Step 770 to form source and drain electrodes 180,185 in contact with the semiconductor layer 170. The source and drain electrodes 180,185 can be formed using any method known in the art, including depositing a uniform layer of conductive material and patterning using photolithography. The source and drain electrodes 180,185 can be formed of any conductive material including metals or conducting metal oxides. In some embodiments the source and drain electrodes 180,185 can be formed using a selective area deposition process. When using a selective area deposition process, a fourth patterned deposition inhibitor layer 870 is provided on substrate 110 and contains regions 880 where the deposition inhibitor is not present as shown in FIGS. 18a and 18b. Preferably, the fourth patterned deposition inhibitor layer 870 is provided using the same method as the first patterned deposition inhibitor layer 810.

Figure 19A:
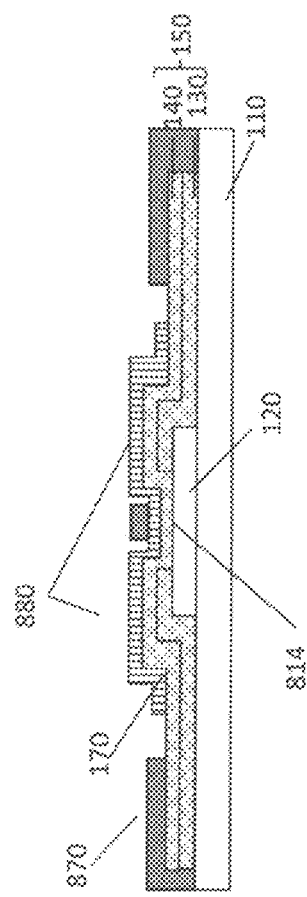
Figure 19B:
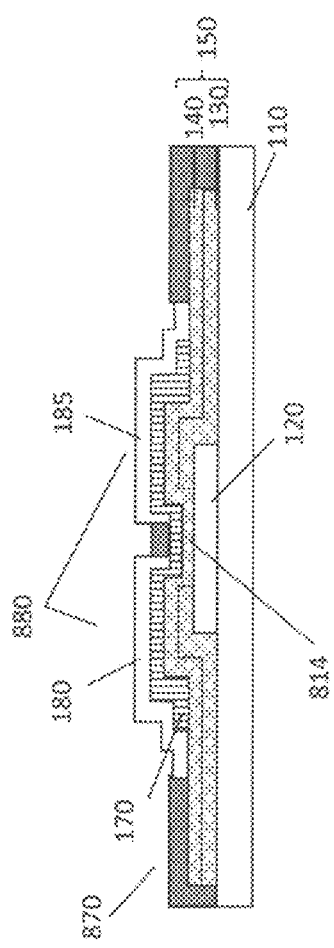

As shown in FIGS. 19a and 19b, the source and drain electrodes 180,185 are obtained by selectively depositing an inorganic conductor material in the region 860 of the fourth deposition inhibitor layer 870 where the deposition inhibitor is not present using an atomic layer deposition process. As shown, the source and drain electrodes 180,185 have the same pattern as the fourth patterned deposition inhibitor layer 870. In this embodiment, the second patterned conductive layer includes a portion that contacts the gate 120 through the contact via formed in the multilayer dielectric layer. Following the selective deposition of the source and drain electrodes 180,185, the fourth patterned deposition inhibitor layer 850 is removed. The resultant structure after inhibitor removal is shown in FIGS. 20a and 20b. The removal processes should be understood from the previous descriptions, and is preferably an O$_2$ plasma process. The structure shown in FIGS. 20a and 20b is equivalent to the structure shown in FIGS. 1a and 1b, and is the result of process Step 770, forming the source and drain electrodes 180,185.

Figure 21:
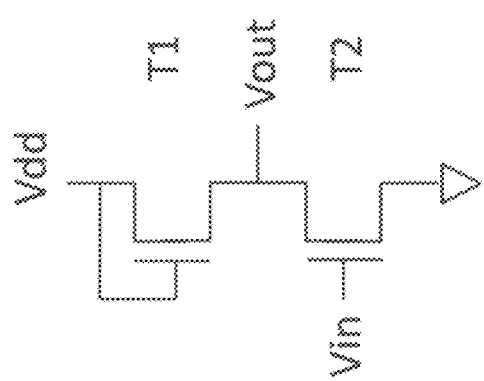
FIG. 21 is an equivalent circuit for an all-enhancement-mode inverter.

FIG. 21 illustrates an equivalent circuit for an all-enhancement-mode inverter. An all enhancement-mode inverter includes the first and second transistors T1 and T2. The first transistor T1 functions as a load transistor, and the second transistor T2 functions as a switching or drive transistor. Both the first TFT T1 and the second TFT T2 are operated in an enhancement mode.

As described above, an enhancement mode device is one that is normally off, and has a threshold voltage greater than zero. Each of the first and second transistors T1 and T2 includes a gate, a gate dielectric layer, a semiconductor layer, and source and drain electrodes. The semiconductor layer may be made of a semiconducting metal oxide material, and is preferably a ZnO-based semiconductor, for example, but not limited to, ZnO or InGaZnO4. As shown in an all-enhancement-mode inverter, the source of the load transistor T1 is electrically connected to the drain of the drive transistor T2, and the drain and gate of the load transistor T1 are electrically connected.

The flow shown in previously discussed FIG. 7 can be used as described to build all-enhancement-mode inverters, and circuits containing them. FIGS. 22a and 22b illustrate the result of using a variable thickness dielectric layer as formed in Step 60, to build enhancement-mode inverters where tuning the relative current-carrying ability of the drive and load TFTs can be accomplished using the gate dielectric thickness of each TFT in addition to the W/L dimensions of their channels. As shown, FIG. 22b is a cross-sectional view of the plan view of FIG. 22a taken along the line A-A'. The specific layout of the inverter is shown in FIGS. 22a and 22b is chosen for simplicity of illustration. Many designs are possible and are within the scope of the current invention as long as they meet the requirements of having a variable thickness dielectric stack 150 and are properly connected as the equivalent circuit diagram of FIG. 21.

As shown in FIGS. 22a and 22b, an enhancement-mode inverter 700 of the present invention has a load transistor 205 having a bottom gate architecture with a first source 280, a first drain 285, a load channel region, a load gate dielectric 255 in the load channel region having a load dielectric thickness, a first semiconductor layer 270, and a first gate electrode 220. The drive transistor 200 of the enhancement-mode inverter 700 of the present invention has a bottom gate architecture with a second source 180, a second drain 185, a drive channel region, a drive gate dielectric 155 in the drive channel region having a drive dielectric thickness less than the load dielectric thickness, a second semiconductor layer 170 and a second gate electrode 120. The drive and load transistors 200, 205 are connected as in the equivalent circuit shown in FIG. 21; the first source 280 is electrically connected to the second drain 185 and the first gate 220 is electrically connected to the first drain 285. The drive and load TFTs 200,205 have a common shared dielectric stack 152 that is a variable thickness dielectric stack 152 of the present invention. As shown in FIGS. 22a and 22b, the variable thickness dielectric stack 152 includes optional dielectric buffer layer 160, a first dielectric layer 130 having a gate via 814 over the gate 120 of the drive TFT 200, and a second dielectric layer 140 that has a uniform thickness in the channel region of both the drive TFT 200 and the load TFT 205. As shown in FIGS. 22a and 22b, the common shared dielectric stack 152 is in contact with the second gate and has first, second, and third regions, the first region being the drive gate dielectric 155 which is in contact with the second semiconductor layer 170 in the drive channel region, the second region is adjacent to the first region and has the drive dielectric thickness, and the third region adjacent to the second region and has the load dielectric thickness. As shown in FIGS. 22a and 22b, the drive and load TFTs 200, 205 can be formed simultaneously and have their individual elements formed in common layers. As shown, the first semiconductor layer 270 and the second semiconductor layer 170 are parts of a common semiconductor layer. The first gate 220 and the second gate 120 are parts of a common first electrically conductive layer. The first source 280, the first drain 285, the second source 180, and the second drain 185 are parts of a common second electrically conductive layer. The variable thickness dielectric layer 152 has contact vias to enable the electrical and physical connections of the inverter 700.

The use of a variable thickness common dielectric stack shown as shown in FIGS. 22a and 22b has the advantage of providing another dimension in sizing and optimizing the TFT size in optimizing the inverter and circuit design. Unlike standard circuit designs, which are limited to using the channel dimensions of the TFTs, the use of the variable thickness common dielectric stack allows the performance of the drive and load TFTs 200,205 to be independently tuned using the thickness of the drive gate dielectric 155 and the load gate dielectric 255.

Some embodiments of the present invention relate to top-gate thin film transistors (TFTs) which, as previously described, have a semiconductor layer that is between the substrate and the gate layer. Unlike bottom gate TFTs, top gate TFTs are inherently protected from the environment since the semiconductor layer is between the substrate and the gate dielectric. When forming top gate TFTs on some substrates, including inorganic substrates, the back-channel interface properties can cause the device to operate in the depletion mode.

FIG. 23a is a cross-sectional diagram of a prior art top gate TFT 500, taken along the line A-A' of the plan view shown in FIG. 23c. The TFT 500 shown in FIG. 13a is a top-gate structure that is representative of any top gate TFT 500, having source and drain electrodes 580,585 in contact with a substrate 510, a semiconductor layer 570 that is over and in contact with the source/drain 580/585, a dielectric layer 530 over and in contact with semiconductor layer 570, and a gate 520 over and in contact with the dielectric layer 520, a so-called staggered structure. FIG. 23b illustrates a different embodiment of a typical top gate TFT where the semiconductor layer 570 is under the source and drain electrodes. The remainder of the device is constructed as shown in FIG. 23a. The substrate 510 can be any previously discussed substrate, and may contain a plurality of pre-defined layers. The substrate 510 is preferably an inorganic substrate. The source and drain have conventionally accepted meanings, and either electrode shown may be designated the source (or drain) as is required by the application or circuit. The source and drain electrodes 580, 585 can be a single conductive material, as shown in FIGS. 23a and 23b or may comprise any number of conductive material layers. The gap between the source and drain electrodes 580, 585 defines the channel of TFT 500, as is conventionally understood. The inorganic semiconductor layer 570 is in contact with both the source and drain electrodes 580, 585 and the substrate 510, as shown in FIG. 23a. The inorganic semiconductor layer 570 can be a metal oxide, for example a ZnO-based material. The dielectric layer 530 can be a single layer of dielectric, as shown, or in embodiments of the present invention the dielectric layer 530 is formed from a variable thickness dielectric layer. The depletion-mode performance of the top gate TFT is useful in combination with the enhancement mode bottom gate TFTs to construct enhancement-depletion-mode inverters and circuits.

Figure 24:
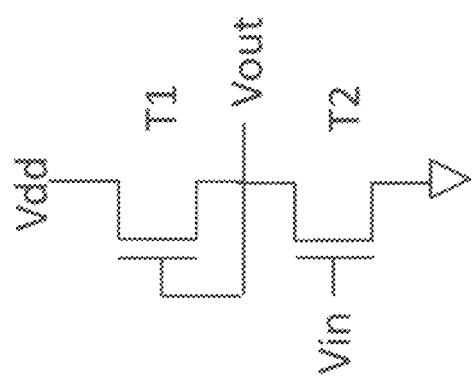
FIG. 24 is an equivalent circuit for an enhancement-depletion mode inverter.

In FIG. 24, an equivalent circuit for an enhancement-depletion-mode inverter is shown. The inverter includes the first and second transistors T1 and T2, which each include the oxide semiconductor. The first transistor T1 functions as a load transistor, and the second transistor T2 functions as a switching or drive transistor. The first transistor T1 is operated in a depletion mode and has a top gate architecture. The second transistor T2 is operated in enhancement mode and has a bottom gate architecture.

The depletion mode operation of the first transistor T1 implies that the threshold voltage is shifted in a negative direction with respect to the threshold of the drive transistor T2. Each of the first and second transistors T1 and T2 includes a gate, a gate dielectric layer, a semiconductor layer, and source and drain electrodes. The semiconductor layer may be made of a semiconducting metal oxide material, and is preferably a ZnO-based semiconductor, for example, but not limited to, ZnO or InGaZnO4. As shown in an enhancement-depletion-mode inverter, the source of the load transistor T1 is electrically connected its own gate, and to the drain of the drive transistor T2.

Figure 25A:
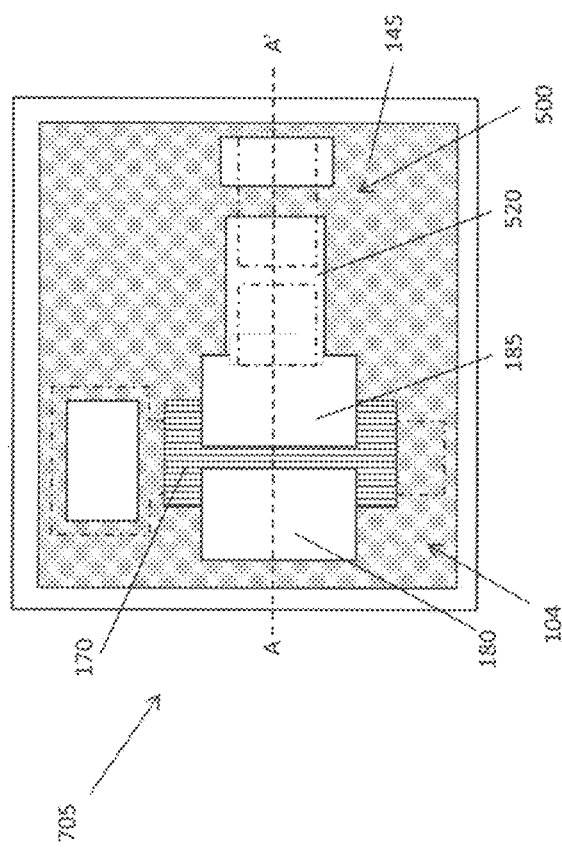
FIGS. 25a and 25b are a plan view and a cross-sectional view, respectively, of an example embodiment of the present invention having an inverter using a bottom-gate drive TFT and a top-gate load TFT.
Figure 25B:
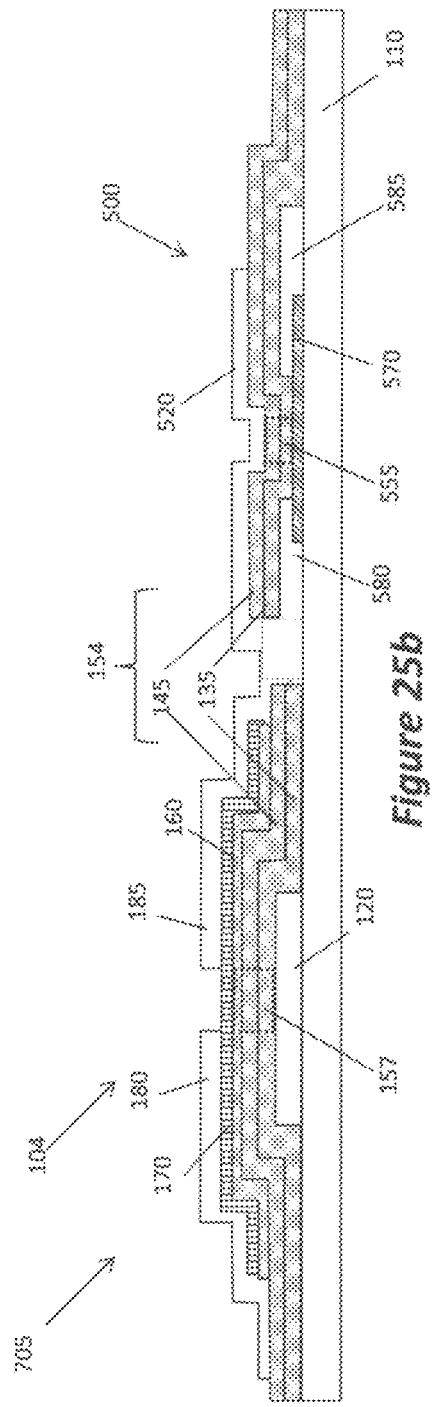

As shown in FIGS. 25a and 25b, an enhancement-depletion-mode inverter 705 of the present invention has a load transistor 500 having a top gate architecture with a first source 580, a first drain 585, a load channel region, a load gate dielectric 555 in the load channel region having a load dielectric thickness, a first semiconductor layer 570, and a first gate electrode 520. The drive transistor 104 of the enhancement-depletion-mode inverter 705 of the present invention has a bottom gate architecture with a second source 180, a second drain 185, drive channel region, a drive gate dielectric 157 in the drive channel region having a drive dielectric thickness different than the load dielectric thickness, a second semiconductor layer 170 and a second gate electrode 120. The drive and load transistors 104, 500 are connected as in the equivalent circuit shown in FIG. 24; the first source 580 is electrically connected to the second drain 185 and the first source 580 is electrically connected to the first gate 520.

The drive and load TFTs 104, 500 have a common shared dielectric stack 154. As shown in FIGS. 25a and 25b, the common dielectric stack 154 includes a first dielectric layer 135 and a second dielectric layer 145 that both have a uniform thickness in the channel regions of both the drive TFT 104 and the load TFT 500. The drive transistor 104 has the optional dielectric buffer layer 160, and has a thicker drive gate dielectric 157 than the load gate dielectric 555.

Figure 26A:
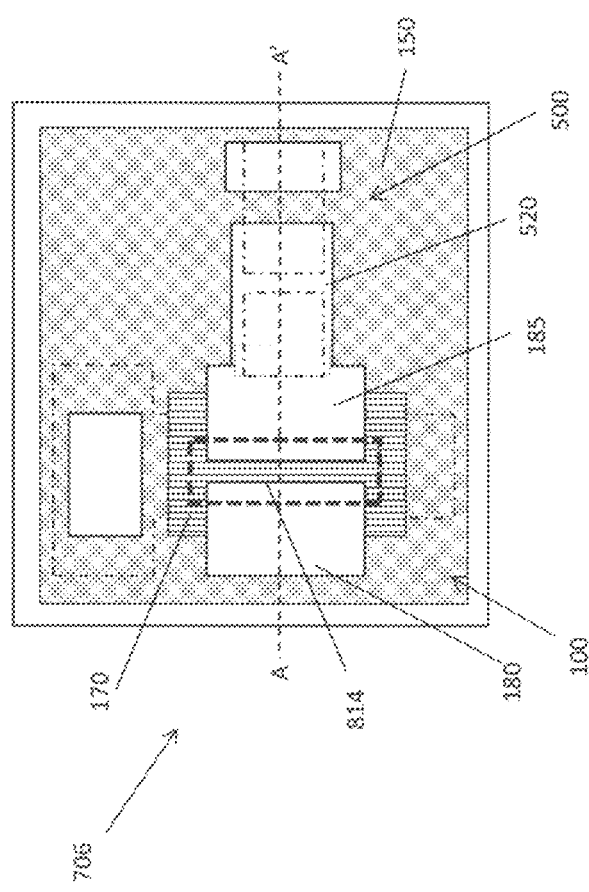
FIGS. 26a and 26b are a plan view and a cross-sectional view, respectively, of one embodiment of the present invention of an inverter using a bottom-gate drive TFT having the variable thickness dielectric stack and a top-gate load TFT.
Figure 26B:
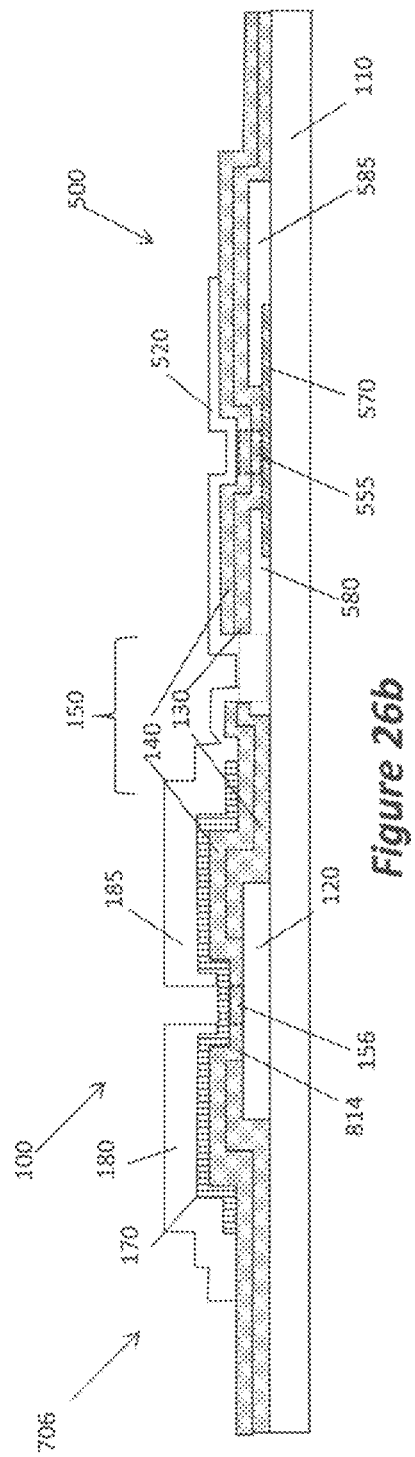

FIGS. 26a and 26b illustrate an enhancement-depletion-mode inverter 706 of the present invention with a load transistor and a drive transistor that share a common dielectric layer that is the variable thickness dielectric layer 150 of the current invention. The load transistor 500 has a top gate architecture with a first source 580, a first drain 585, a load channel region, a load gate dielectric 555 in the load channel region having a load dielectric thickness, a first semiconductor layer 570, and a first gate electrode 520 and a drive transistor 100 having a bottom gate architecture with a second source 180, a second drain 185, drive channel region, a drive gate dielectric 156 in the drive channel region having a drive dielectric thickness different than the load dielectric thickness, a second semiconductor layer 170 and a second gate electrode 120. The drive and load transistors 100, 500 are connected as in the equivalent circuit shown in FIG. 24; the first source 580 is electrically connected to the second drain 185 and the first source 580 is electrically connected to the first gate 520.

The drive and load TFTs 100, 500 have a common shared dielectric stack 150. As shown in FIGS. 26a and 26b, the dielectric stack 150 is a variable thickness dielectric stack 150 of the present invention. As shown in FIGS. 26a and 26b, the variable thickness dielectric stack 150 has a first dielectric layer 130 having a gate via 814 over the gate 120 of the drive TFT 100, and a second dielectric layer 140 that has a uniform thickness in the channel region of both the drive TFT 100 and the load TFT 500. As shown in FIGS. 26a and 26b, the common shared dielectric stack 150 is in contact with the second gate and has first, second, and third regions, the first region being the drive gate dielectric 156 that is in contact with the second semiconductor layer 170 in the drive channel region, the second region adjacent to the first region and having the drive dielectric thickness, and the third region adjacent to the second region and having load dielectric thickness.

The use of a variable thickness common dielectric stack shown in FIGS. 25a and 25b and 26a and 26b has the advantage of providing another dimension in sizing and optimizing the TFT size in optimizing the inverter and circuit design. Unlike standard circuit designs, which are limited to using the channel dimensions of the TFTs, the use of the variable thickness common dielectric stack allows the performance of the drive and load TFTs to be independently tuned using the thickness of the drive gate dielectric and the load gate dielectric. Additionally, by using a top gate architecture for the depletion-mode load TFT with the same semiconductor material as the bottom gate drive TFT, as well as common layers allows for simple manufacturing of such circuits. As shown in FIGS. 25a and 25b and 26a and 26b, the drive and load of an enhancement-depletion-mode inverter can be formed simultaneously and have their individual elements formed in common layers.

Figure 27:
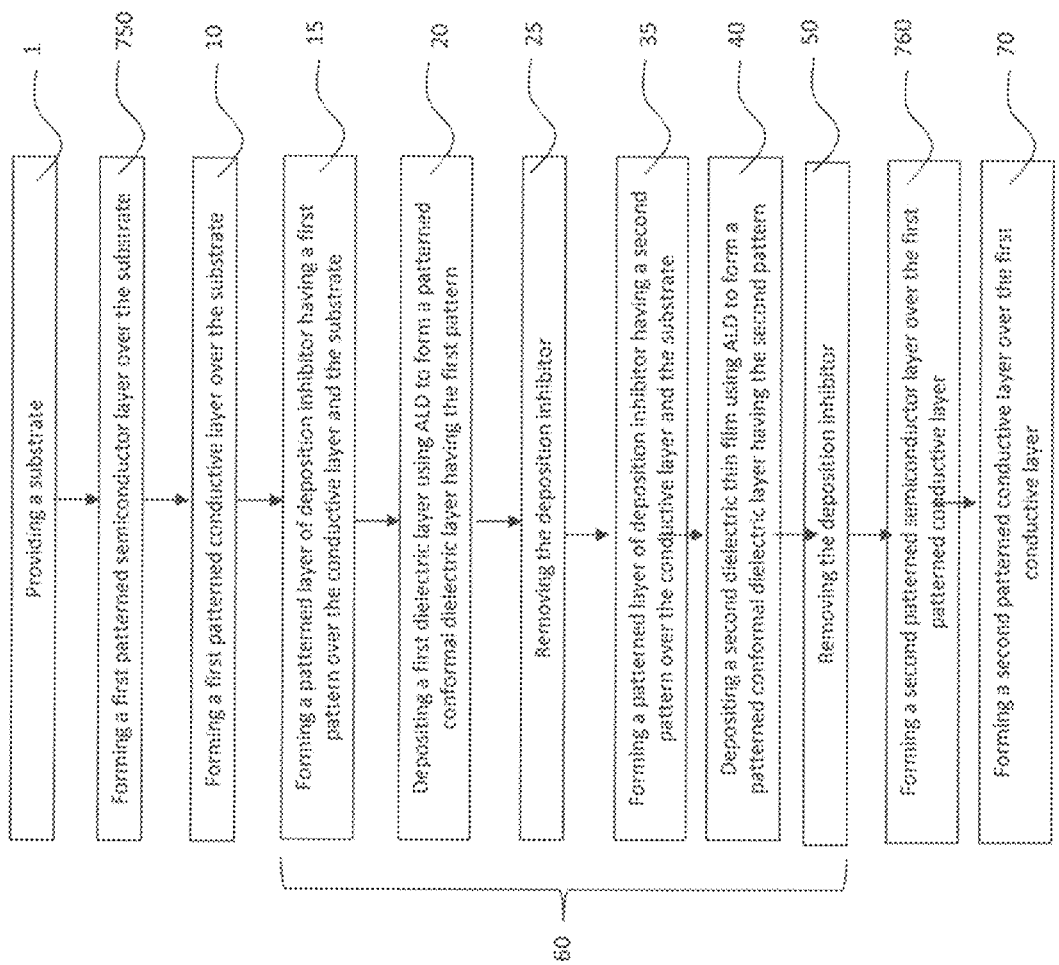
FIG. 27 is a flow chart describing the steps of an example embodiment of a process for forming an enhancement-depletion mode inverter with a drive TFT having a variable thickness dielectric.

FIG. 27 is a Step diagram having a process flow derived from that of FIG. 5 to form an enhancement-depletion-mode inverter with a staggered bottom gate drive TFT and a top gate load TFT that share a common variable thickness dielectric layer, as illustrated in FIGS. 26a and 26b. FIG. 27 serves to further illustrate the process flow of FIG. 5, with additional steps useful in forming any thin film transistor structure, and also to fabricate multiple architectures on a single substrate. By appropriately choosing the pattern of each layer, top and bottom gate transistors can easily be built using the same process. FIG. 27 includes all of the steps of FIG. 5, namely Step 1 providing a substrate, Step 10 forming a first patterned conductive layer, Step 60, forming a variable thickness dielectric stack, as defined by Steps 15 through 50, and Step 70 forming a second patterned conductive layer which should be understood from the previous descriptions. FIG. 27 includes the additional steps of forming a first patterned semiconductor layer in Step 750, and forming a second patterned semiconductor layer in step 760.

When using the process flow shown in FIG. 27 to fabricate enhancement-depletion mode inverter illustrated in FIG. 26, the first patterned conductive layer formed in Step 10 forms the gate 120 of the drive TFT, and the source and drain electrode 580, 585 of the load TFT. The first patterned semiconductor layer 570 can be formed either before the first conductive layer (as shown in FIG. 27), or alternatively after forming the first conductive layer. The first patterned semiconductor layer 570 is the semiconductor layer for the load TFT, and is in contact with the source and drain electrodes 580, 585 formed in Step 10.

The variable thickness dielectric stack formed in Step 60 is common to both the drive TFT and the load TFT. The variable thickness dielectric stack formed such that the drive gate dielectric 156 of the drive TFT is thinner than the load gate dielectric 555 thickness. After forming the variable thickness dielectric stack 150, a second semiconductor layer 170 is formed in Step 765. The second semiconductor layer 170 is the semiconductor layer 170 for the drive TFT 100, and is in contact with the source and drain electrodes 180,185 that are formed in Step 70. Step 70 forms the second conductive layer which contains the source and drain electrodes 180,185 of drive TFT 100 and the gate 520 of the load TFT 500. The second conductive layer can be formed either before or after the second semiconductor layer 170, depending on the desired architecture of the drive TFT.

Each transistor formed using the process of FIG. 27 has a channel region and a region where the source and the drain electrode overlap at least a portion of the gate to form an overlap region, this overlap region being adjacent to the channel region. The overlap region of the drive TFT has at least two portions: a first portion of the overlap region that includes both the first and the second dielectric layers, and a second portion of the overlap region which includes only one of the first or second dielectric layers. The second portion of the overlap region of the drive TFT is adjacent to the channel region of the drive TFT, and the second portion of the overlap region is between the channel region of the drive TFT and the first portion of the overlap region of the drive TFT. The channel region and the second portion of the overlap region have the same thickness. The first portion of the overlap region and includes both the first and the second dielectric layers, and is further from the channel to prevent against the source or drain electrode shorting to the gate. In contrast, the overlap region of the load TFT only as a single region that includes both the first and second dielectric layers. The thickness of the dielectric layer having the channel via can be used to independently tune the gate dielectric thickness of the drive and load TFTs.

EXAMPLES

General Conditions for the Preparation of Layers Using Atmospheric Pressure ALD

Figure 28:
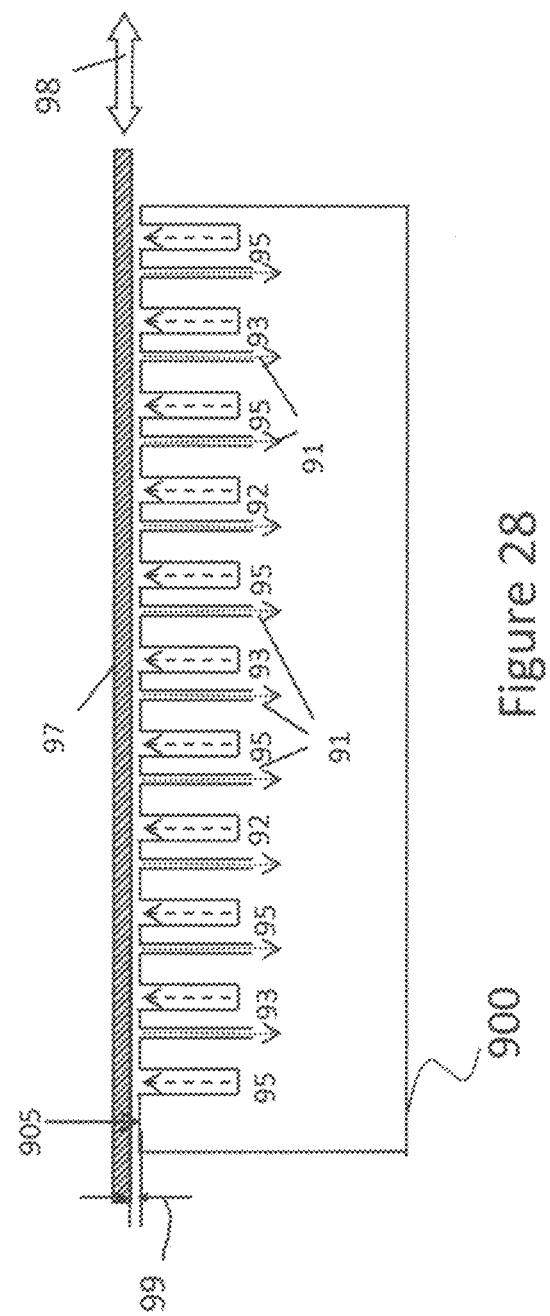
FIG. 28 is a cross-sectional side view of a deposition device used for thin film deposition in the Examples.

The preparation of a thin film coating of the material layers on glass substrates as used in the examples is described below. The ALD coating device used to prepare these layers, namely aluminum oxide, ZnO:N, and Al-doped ZnO (AZO), has been described in detail in US Patent Application Publication No. US 2009/0130858, the disclosure of which is herein incorporated by reference in its entirety. The coating device has an output face (facing up) that contains spatially separated elongated gas channels and operates on a gas bearing principle. The coating device can be understood with respect to delivery head 900 shown in FIG. 28. Each gas channel is composed of an output slot 95, 93, 92 which supplies gas to the output face 905, and adjacent exhaust slots 91 which remove gas from the output face 905. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which results in ALD deposition. A 2.5 by 2.5 inch square (62.5 mm square) glass substrate attached to a heated backer is positioned above the output face of the coating device and is maintained in close proximity to the output face by an equilibrium between the pull of gravity, the flow of the gases supplied to the output face, and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating of both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the substrate across the coating head for the number of cycles necessary to obtain a uniform deposited film of the desired thickness for the given example. The coating head as described above contains two full ALD cycles (two oxygen and two metal exposures per single direction pass over the head), therefore a round trip oscillation represents 4 ALD cycles. All samples were coated at a substrate temperature of 200° C.

TABLE 1

| Layer | DMAI flow (sccm) | DEZ flow (sccm) | NH3 flow (sccm) | Water flow (sccm) | $N_2$ dilution with Metal Alkyl (sccm) | $N_2$ dilution with water (sccm) | $N_2$ Inert Purge (sccm) | Residence Time (ms) |
|---|---|---|---|---|---|---|---|---|
| $Al_2O_3$ | 65 | 0 | 0 | 65 | 1500 | 2250 | 3000 | 50 |
| ZnO:N | 0 | 60 | 4 | 45 | 1500 | 2250 | 3000 | 50 |
| AZO | 10 | 30 | 0 | 22.5 | 1500 | 2250 | 3000 | 50 |

Bottom Gate TFT Experiments to Probe the Variable Thickness Dielectric Layer

In order to probe the impact of the variable thickness dielectric layer on transistor performance and stability, staggered (i.e. "top contact") bottom-gate TFTs were built using the spatial atomic layer deposition tool described above. The Example TFTs were fabricated as described below, and the relative differences between the samples are called out in the following descriptions for clarity. Inventive TFTs were fabricated using the process flow described in FIG. 7. Electrical testing of the transistors was accomplished by using a probe station to contact the gate and source/drain electrodes. The transistors were swept in the saturation regime, with the drain being held constant at 14 V (Vd=14 V), and the gate voltage was swept over the range indicated.

Comparative Example C1

Bottom Gate TFT with Standard 500 Å Dielectric

Comparative Example C1 is a bottom-gate device having a constant thickness dielectric stack. Comparative Example C1 was fabricated using the combination of spatial ALD and selective area deposition (SAD). The gate layer was 1000 Å of AZO, the gate dielectric was 500 Å of $Al_2O_3$, 200 Å of ZnO:N was used for the semiconductor layer and 1000 Å AZO was used for the source and drain electrodes. The printed inhibitor used to pattern each of the device layers was a 2 wt % polyvinyl pyrrolidone (PVP) k30 in diacetone alcohol solution which was printed using a Dimatix 2500 printer. The printing was done using the 10 pL cartridge which resulted in a spot size on the substrate of approximately 90 microns under typical operating conditions. The patterns were printed at a pixel-to-pixel distance of 70 microns (363 dpi). The pattern of PVP used to pattern the AZO layer in the source and drain pattern was left on the device during testing, such that the back channel of the semiconductor layer was covered by a thin layer of PVP k30. The transistor had as designed dimensions of W=6 pixel/L=1 pixel. The performance data for Comparative Example C1 can be found in the Id-Vg curve shown in FIG. 29.

Inventive Example I1

Bottom Gate TFT with an Extra 250 Å Outside of the Channel Region

Inventive Example I1 is a bottom-gate transistor with the variable thickness dielectric stack of the present invention. Inventive Example I1 was fabricated as Comparative Example C1 with the following exceptions. After removing the PVP used to pattern the gate, a 250 Å extra dielectric layer having a gate via was formed using selective area deposition. The transistors were completed and characterized as in comparative example C1. The performance data for Inventive Example I1 can be found in the Id-Vg curve shown in FIG. 29.

Inventive Example I1

Bottom Gate TFT with an Extra 500 Å Outside of the Channel Region

Inventive Example I1 is a bottom-gate transistor with the variable thickness dielectric stack of the present invention. Inventive Example I1 was fabricated as Comparative Example C1 with the following exceptions. After removing the PVP used to pattern the gate, a 500 Å extra dielectric layer having a gate via was formed using selective area deposition. The transistors were completed and characterized as in comparative example C1. The performance data for Inventive Example I2 can be found in the Id-Vg curve shown in FIG. 29.

Figure 29:
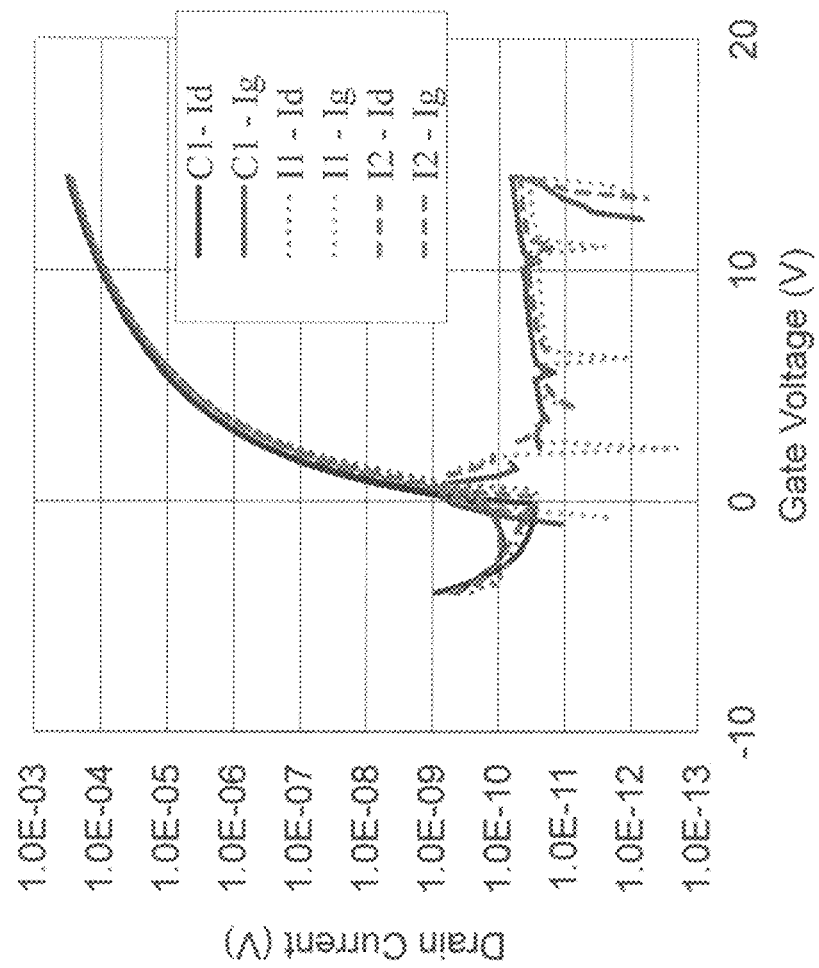
FIG. 29 is a graph illustrating the relationship between gate voltage and drain current for a 500 A gate oxide transistor of the present invention.

As can be seen in FIG. 29, the inventive examples having the extra dielectric outside of the channel region perform similarly to the comparative example without the extra dielectric layer, having the same gate dielectric thickness within the channel region.

All-Enhancement-Mode Inverters

In order to further probe the usefulness of the variable thickness dielectric stack, all enhancement-mode inverters were fabricated in five stage ring oscillator circuits. The Example circuits were fabricated as described below, and the relative differences between the samples are called out in the following descriptions for clarity. Inventive inverter circuits were fabricated using the process flow described in FIG. 7.

Comparative Example C2

Inverter with Fixed Thickness Dielectric Stack

Comparative example C2 was prepared generally as described above for comparative example C1 and each of the transistors of C2 used the same process as comparative example C1. However, comparative example C2 used patterns to form all-enhancement-mode inverters arranged into a five-stage ring oscillator. Each transistor in each of the inverters had the same dielectric thickness, 500 Å, as in comparative example C1. The drive transistors for each inverter had as designed W=6 pixel/L=1 pixel, and the load transistors for each inverter had an as designed W=3 pixel/L=3 pixel. The sample was analyzed by using a probe station to contact the AZO Vdd, ground, and output nodes of the ring oscillator, and the oscillator was characterized as a function of Vdd. The frequency, time per stage, and fraction of the peak-to-peak swing for Vdd=16 V can be found in Table 2.

Comparative Example C3

Inverter with Fixed Thickness Dielectric Stack

Comparative example C3, was prepared as Comparative example C2 with the following exception. The drive transistors for each inverter had as designed W=12 pixel/L=1 pixel, and the load transistors for each inverter had an as designed W=4 pixel/L=3 pixel. The circuit was characterized as in Comparative example C2, and the frequency, time per stage, and fraction of the peak-to-peak swing for Vdd=16 V can be found in Table 2.

Inventive Example I3

Inverter with Variable Thickness Dielectric Stack

Inventive example I3, was prepared as comparative example C1 with the following exception. After removing the PVP used to pattern the gate, a 250 Å extra dielectric layer having a gate via was formed using selective area deposition (as in Inventive Example I1). The pattern is chosen so that the inverters have the variable dielectric stack illustrated in FIGS. 22a and 22b. This results in inverters of Inventive Example I3 having drive TFTs with a total gate dielectric thickness of 500 Å, and the load TFT having a total gate dielectric thickness of 750 Å. The drive transistors for each inverter had as designed W=6 pixel/L=1 pixel, and the load transistors for each inverter had an as designed W=3 pixel/L=3 pixel. The circuit was characterized as in Comparative example C2, and the frequency, time per stage, and fraction of the peak-to-peak swing for Vdd=16 V can be found in Table 2.

Inventive Example I4

Inverter with Variable Thickness Dielectric Stack

Inventive example I4, was prepared as comparative example I3. The drive transistors for each inverter had as designed W=6 pixel/L=1 pixel, and the load transistors for each inverter had an as designed W=3 pixel/L=1 pixel. The circuit was characterized as in Comparative example C2, and the frequency, time per stage, and fraction of the peak-to-peak swing for Vdd=16 V can be found in Table 2.

Inventive Example I5

Inverter with Variable Thickness Dielectric Stack

Inventive example I5, was prepared as comparative example I3. The drive transistors for each inverter had as designed W=12 pixel/L=1 pixel, and the load transistors for each inverter had an as designed W=4 pixel/L=1 pixel. The circuit was characterized as in Comparative example C2, and the frequency, time per stage, and fraction of the peak-to-peak swing for Vdd=16 V can be found in Table 2.

TABLE 2

| Sample | Drive TFT W/L | Load TFT W/L | Drive TFT Dielectric (Å) | Load TFT Dielectric (Å) | time/ stage (ms) | Freq (Hz) | fraction |
| --- | --- | --- | --- | --- | --- | --- | --- |
| C2 | 6/1 | 3/3 | 500 | 500 | 111.4 | 1795 | 0.328 |
| C3 | 12/1 | 4/3 | 500 | 500 | 129.4 | 1546 | 0.395 |
| I3 | 6/1 | 3/3 | 500 | 750 | 152.0 | 1315 | 0.41 |
| I4 | 6/1 | 3/1 | 500 | 750 | 93.8 | 2132 | 0.33 |
| I5 | 12/1 | 4/1 | 500 | 750 | 123.6 | 1618 | 0.41 |

As can be seen in Table 2, inverters and circuits containing the variable thickness dielectric stack of the present invention can be fabricated. The variable dielectric stack provides the ability to independently select the gate dielectric thickness of the drive and load TFTs in an inverter. Comparing C2 and I3, for inverters with the drive and load TFT with the same channel dimensions, an increase in the dielectric thickness of the load TFT results in a slower inverter and ring oscillator due to the reduction in the saturation current of the load TFT. As shown in I4, this lower current can be traded off with the length of the load TFT to form a faster circuit with a smaller footprint. The comparison between C3 and I5 also illustrates the trade off of the load transistor gate dielectric thickness with for a smaller footprint. Using inverters with the variable thickness dielectric stack, circuits layouts can be optimized simultaneously for footprint and performance.

Enhancement-Depletion-Mode Inverters

In order to further probe the usefulness of the enhancement-depletion-mode inverters of the present invention, enhancement-depletion-mode inverters were fabricated in five stage ring oscillator circuits. The Example circuits were fabricated as described below, and the relative differences between the samples are called out in the following descriptions for clarity. In order to further probe the usefulness of the variable thickness dielectric stack, Inventive Enhancement-depletion-mode inverters were fabricated using the process flow described in FIG. 27.

Inventive Example I6

Enhancement-Depletion-Mode Inverter with Common Dielectric Stack

Inventive Example I6 was fabricated using the combination of spatial ALD and selective area deposition (SAD) on a glass substrate. A 200 Å ZnO:N semiconductor layer for the top gate load TFT was formed first, so that the back channel was in contact with the glass. Next, the first conductive layer containing the gate of the bottom gate drive TFT and the source and drain for the load TFT was formed using 1000 Å AZO. A 400 Å common dielectric layer was formed from two separately patterned 200 Å dielectric layers of $Al_2O_3$ to make the gate dielectric for the load TFT and a portion of the gate dielectric for the drive TFT. Next, a buffer layer and the semiconductor layer of the drive TFT were formed from a single inhibitor pattern with 100 Å of $Al_2O_3$ and 200 Å of ZnO:N. The second conductive layer containing the source and drain of the bottom gate drive TFT and the gate for the load TFT was formed using 1000 Å AZO. The printed inhibitor used to pattern each of the device layers was a 2 wt % polyvinyl pyrrolidone (PVP) k30 in diacetone alcohol solution which was printed using a Dimatix 2500 inkjet printer. All device layers were deposited using SALD and the conditions listed in Table 1. The pattern is chosen so that the inverters have the common dielectric stack illustrated in FIGS. 25a and 25b. This results in inverters of Inventive Example I3 having drive TFTs with a total gate dielectric thickness of 500 Å, and the load TFT have a total gate dielectric thickness of 400 Å. The drive transistors for each inverter had as designed W=12 pixel/L=1 pixel, and the load transistors for each inverter had an as designed W=1 pixel/L=3 pixel. The ring oscillator also had a buffer inverter with a drive transistor as designed W=12 pixel/L=1 pixel, and a load transistor as designed W=4 pixel/L=3 pixel. The circuit was characterized as in Comparative example C2, and the frequency, time per stage, and fraction of the peak-to-peak swing for Vdd=11.5 V can be found in Table 3.

Inventive Example I7

Enhancement-Depletion-Mode Inverter with Common Dielectric Stack

Inventive example I7, was prepared as comparative example I6 with the following exception. After removing the PVP used to pattern the first conductive layer, a 500 Å extra dielectric layer having gate via for the drive TFT was formed using selective area deposition. The common dielectric layer was 300 Å formed from two separately patterned 150 Å dielectric layers of $Al_2O_3$, and the buffer layer for the drive TFT was 200 Å of $Al_2O_3$. The pattern is chosen so that the inverters have the variable dielectric stack illustrated in FIGS. 26a and 26b, with the addition of a dielectric buffer layer 160 with the same pattern as semiconductor layer 170. This results in inverters of Inventive Example I7 having drive TFTs with a total gate dielectric thickness of 500 Å, and the load TFT having a total gate dielectric thickness of 800 Å. The circuit design is the same as in Inventive Example I6. The circuit was characterized as in Comparative example C2, and the frequency, time per stage, and fraction of the peak-to-peak swing for Vdd=11.5 V and 7.5 V can be found in Table 3.

Inventive Example I8

Enhancement-Depletion-Mode Inverter with Common Dielectric Stack

Inventive example I8, was prepared as comparative example I7 with the following exception. The circuit design had a different design; the drive transistors for each inverter had as designed W=12 pixel/L=1 pixel, and the load transistors for each inverter had an as designed W=3 pixel/L=3 pixel. The circuit was characterized as in Comparative example C2, and the frequency, time per stage, and fraction of the peak-to-peak swing for Vdd=11.5 V and 7.5 V can be found in Table 3.

Inventive Example I9

Enhancement-Depletion-Mode Inverter with Common Dielectric Stack

Inventive example I9, was prepared as comparative example I8 with the following exception. The common dielectric layer was 150 Å formed from two separately patterned 75 Å dielectric layers of $Al_2O_3$, and the buffer layer for the drive TFT was 100 Å of $Al_2O_3$. This results in inverters of Inventive Example I8 having drive TFTs with a total gate dielectric thickness of 250 Å, and the load TFT have a total gate dielectric thickness of 650 Å. The circuit design is the same as in Inventive Example I6. The circuit was characterized as in Comparative example C2, and the frequency, time per stage, and fraction of the peak-to-peak swing for Vdd=7.5 V and 11.5 V can be found in Table 3.

TABLE 3

| Sample | Vdd (V) | Load TFT W/L | Drive TFT Dielectric (Å) | Load TFT Dielectric (Å) | time/stage (ms) | Freq (Hz) | fraction |
|---|---|---|---|---|---|---|---|
| I6 | 11.5 | 1/3 | 500 | 400 | 79 | 2532 | 0.243 |
| I7 | 7.5 | 1/3 | 500 | 800 | 492 | 407 | 0.853 |
| I7 | 11.5 | 1/3 | 500 | 800 | 411 | 486 | 0.983 |
| I8 | 7.5 | 3/3 | 500 | 800 | 308 | 649 | 0.843 |
| I8 | 11.5 | 3/3 | 500 | 800 | 264 | 757 | 0.983 |
| I9 | 7.5 | 3/3 | 250 | 650 | 140 | 1426 | 0.917 |
| I9 | 11.5 | 3/3 | 250 | 650 | 119 | 1680 | 0.957 |

As can be seen in Table 3, enhancement-depletion-mode inverters and circuits can be formed with a common dielectric stack, where the thickness of the drive gate dielectric for the bottom gate drive TFT can be controlled independently from the load gate dielectric of the top gate load TFT. Inventive example I6 illustrates the ability to form very fast circuits by using a load TFT with a thinner dielectric than that of the drive TFT. Inventive examples I7, I8 and I9 illustrate the performance of enhancement-depletion-mode inverters using the variable thickness dielectric stack of the present invention. The dielectric thickness differences can be adjusted modifying either the thickness of the common portion of the dielectric stack as shown in I8 and I9, or by changing the thickness of the extra dielectric layer in the variable thickness dielectric stack. Using inverters with the variable thickness dielectric stack, circuit layouts can be optimized simultaneously for footprint and performance.

The invention has been described in detail with particular reference to certain preferred embodiments thereof, but it will be understood that variations and modifications can be effected within the scope of the invention.

PARTS LIST 1 providing a substrate
10 forming a first patterned conductive layer
15 forming a first patterned layer of deposition inhibitor
20 depositing a first dielectric layer using ALD
25 removing the deposition inhibitor
35 forming a second patterned layer of deposition inhibitor
40 depositing a first dielectric layer using ALD
50 removing the deposition inhibitor
60 forming a variable thickness dielectric stack
70 forming a first patterned conductive layer
91 vacuum
92 metal precursor flow
93 oxidizer-containing flow
95 nitrogen purge flow
97 example substrate
98 arrow
99 gap
100 bottom gate TFT
102 bottom gate TFT
103 bottom gate TFT
104 bottom gate TFT
110 substrate
120 gate
130 first dielectric layer
140 thin film dielectric material layer
143 dielectric buffer layer
145 second dielectric layer
150 variable thickness dielectric stack
152 variable thickness dielectric stack
153 variable thickness dielectric stack
155 drive gate dielectric
156 drive gate dielectric
157 drive gate dielectric
160 buffer layer
170 semiconductor layer
180 sourced
185 drain
200 drive transistor
205 load transistor
220 first gate electrode
255 load gate dielectric
270 first semiconductor layer
280 sourced
285 drain
425 gate length
455 channel length
450 channel region
460 first region
470 second region
475 length
500 top gate transistor
505 top gate transistor
510 substrate
520 gate
530 dielectric layer
555 load gate dielectric
570 patterned semiconductor layer
580 source
585 drain
605 first pattern deposition inhibitor layer
615 second patterned deposition inhibitor layer
620 first patterned conductive layer
630 patterned first dielectric layer
640 patterned second dielectric layer
650 variable thickness dielectric stack
675 overlap region
680 second patterned conductive layer
690 first portion of the overlap region
695 second portion of the overlap region
700 inverter
705 inverter
706 inverter
710 forming a patterned gate
750 forming a first patterned semiconductor layer
760 forming a second patterned semiconductor layer 765 forming a patterned semiconductor layer
770 forming source and drain electrodes
810 first patterned deposition inhibiting material layer
812 contact via
814 gate via
820 region where the deposition inhibiting material layer is not present
822 contact via portion of the deposition inhibitor layer
824 gate via portion of the deposition inhibitor layer
830 second patterned deposition inhibiting material layer
840 region where the deposition inhibiting material layer is not present
850 third patterned deposition inhibiting material layer
860 region where the deposition inhibiting material layer is not present
870 fourth patterned deposition inhibiting material layer
880 region where the deposition inhibiting material layer is not present
900 delivery head
905 output face

The invention claimed is:

1. A transistor comprising:
a substrate;
an electrically conductive gate over the substrate, the gate having a gate length;
a source electrode and a drain electrode over the substrate, the source and drain electrodes separated by a gap defining a channel region, the channel region having a channel length that is less than the gate length;
a semiconductor layer in contact with the source and drain electrodes, the semiconductor layer having a semiconductor pattern;
a dielectric stack having a portion between the gate and the semiconductor layer, the portion of the dielectric stack having a surface that is in contact with the gate across the entire surface of the portion of the dielectric stack and having a plurality of dielectric layers that are in contact with each other with no intervening non-dielectric layers, wherein the portion of the dielectric stack includes first, second, and third regions, the first region in contact with the semiconductor layer in the channel region and having a first thickness, the second region adjacent to the first region and having the first thickness, and the third region adjacent to the second region and having a thickness that is greater than the first thickness;
wherein one of the plurality of dielectric layers in the dielectric stack is a buffer layer that is in contact with the semiconductor layer, and wherein the buffer layer has the same pattern as the semiconductor layer such that terminating edges of the buffer layer are aligned to be coincident with terminating edges of the semiconductor layer;
wherein another of the plurality of dielectric layers in the portion of the dielectric stack has a pattern such that it is present in the third region but is not present in the first and second regions such to provide the greater thickness.

2. The transistor of claim 1, wherein the semiconductor layer is under the source electrode and under the drain electrode.

3. The transistor of claim 1, wherein the semiconductor layer is over the source electrode and over the drain electrode.

4. The transistor of claim 1, wherein the gate is it contact with the substrate.

5. The transistor of claim 1, wherein the source electrode and the drain electrode are in contact with the substrate.

6. The transistor of claim 1, wherein each of the plurality of dielectric layers of the dielectric stack has the same material composition.

7. The transistor of claim 6, wherein there is an interface region between each of the layers of the plurality of dielectric layers.

8. The transistor of claim 1, wherein one of the plurality of dielectric layers includes a different material than another of the plurality of layers.

9. The transistor of claim 1, wherein the semiconductor layer has a length greater than the gate length.

* * * * *